(12) United States Patent
Suzuki et al.

(10) Patent No.: US 6,690,049 B2
(45) Date of Patent: Feb. 10, 2004

(54) SOLID-STATE IMAGE SENSOR, PRODUCTION METHOD OF THE SAME, AND DIGITAL CAMERA

(75) Inventors: Satoshi Suzuki, Tokyo (JP); Naoki Ohkouchi, Kanagawa-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/304,379

(22) Filed: Nov. 26, 2002

(65) Prior Publication Data

US 2003/0071271 A1 Apr. 17, 2003

Related U.S. Application Data

(62) Division of application No. 09/726,897, filed on Nov. 30, 2000, now Pat. No. 6,518,640.

(30) Foreign Application Priority Data

Dec. 2, 1999 (JP) ............................................. 11-343029
Dec. 28, 1999 (JP) ............................................. 11-374383

(51) Int. Cl.$^7$ ......................................... H01L 31/0232
(52) U.S. Cl. ....................... 257/294; 257/223; 257/229; 257/432; 257/435; 348/273; 348/340
(58) Field of Search ................................ 257/294, 223, 257/229, 432, 435; 348/273, 340

(56) References Cited

U.S. PATENT DOCUMENTS

| 5,610,390 A | 3/1997 | Miyano |
|---|---|---|
| 6,008,511 A | 12/1999 | Tokumitsu et al. |
| 6,344,666 B1 | 2/2002 | Yamaguchi et al. |
| 6,388,709 B1 * | 5/2002 | Kobayashi et al. ......... 348/362 |

FOREIGN PATENT DOCUMENTS

| JP | 1-213076 A | 8/1989 |
|---|---|---|
| JP | 1-213077 A | 8/1989 |
| JP | 1-213078 A | 8/1989 |
| JP | 2600250 | 4/1997 |

OTHER PUBLICATIONS

Akira Ishikawa, Akiko Sakamoto, Tatsuo Niwa, *Electrochromic Display for Indicating the Focus Sensing Area on the Camera Finder.*, Nippon Shashin Gakkai Shi, vol. 60, No. 5, Sep. 1997, pp. 303–306.

* cited by examiner

*Primary Examiner*—Jerome Jackson
(74) *Attorney, Agent, or Firm*—Peter S. Gilster; Greensfelder, Hemker & Gale, P.C.

(57) ABSTRACT

The present invention provides a solid-state image sensor wherein the color shading is decreased, and/or a solid-state image sensor wherein the shading effect is outstanding. Moreover, the invention provides a digital camera having the solid-state image sensor. The solid-state image sensor of the present invention has color filters and/or apertures of a light blocking layer, and the center of the color filters and/or the center of the apertures of the light blocking layer is offset with respect to the center of a light-receiving part, in the direction to the center of a valid cell area. In each photo-detecting cell of a preferred solid-state image sensor, micro-lenses are further placed on the light-receiving side of the solid-state image sensor, and preferably, the center of the micro-lens is similarly offset with respect to the center of the light-receiving part. Also, the digital camera is mounted with an above-described solid-state image sensor.

11 Claims, 24 Drawing Sheets

(a)

D-BLOCK  C-BLOCK  B-BLOCK  A-BLOCK (b)

| BLOCK | | SIZE (mm) | OFFSET AMOUNT OF COLOR FILTERS (μm) | OFFSET AMOUNT OF MICRO-LENS (μm) |
|---|---|---|---|---|
| A | X | 8 | 0 | 0 |
|   | Y | 6 | 0 | 0 |
| B | X | 16 | 0.4 | 0.5 |
|   | Y | 10 | 0.3 | 0.38 |
| C | X | 24 | 0.8 | 1.0 |
|   | Y | 16 | 0.6 | 0.75 |

OFFSET AMOUNT OF MICRO-LENS

Fig. 11

| DISTANCE OF EXIT PUPIL l (mm) | HEIGHT OF IMAGE p (mm) | d1 (μm) | d2 (μm) | d3 (μm) | Sm by EQUATION (μm) | ACTUAL Sm (μm) | SocF by EQUATION (μm) | ACTUAL SocF (μm) | SopN by EQUATION (μm) | ACTUAL SopN (μm) |
|---|---|---|---|---|---|---|---|---|---|---|
| 80 | 15 | 7 | 1.5 | 4.5 | 0.8493 | 0.8493 | 0.6673 | 0.6673 | 0.3033 | 0.3033 |
| 80 | 7.5 | 7 | 1.5 | 4.5 | 0.3991 | 0.4247 | 0.3135 | 0.3337 | 0.1425 | 0.1517 |
| 80 | 3.75 | 7 | 1.5 | 4.5 | 0.1999 | 0.2123 | 0.1571 | 0.1668 | 0.0714 | 0.0758 |
| 80 | 1.88 | 7 | 1.5 | 4.5 | 0.1 | 0.1062 | 0.0786 | 0.0834 | 0.0357 | 0.0379 |
| 80 | 0.94 | 7 | 1.5 | 4.5 | 0.05 | 0.0531 | 0.0393 | 0.0417 | 0.0179 | 0.019 |

Fig.12
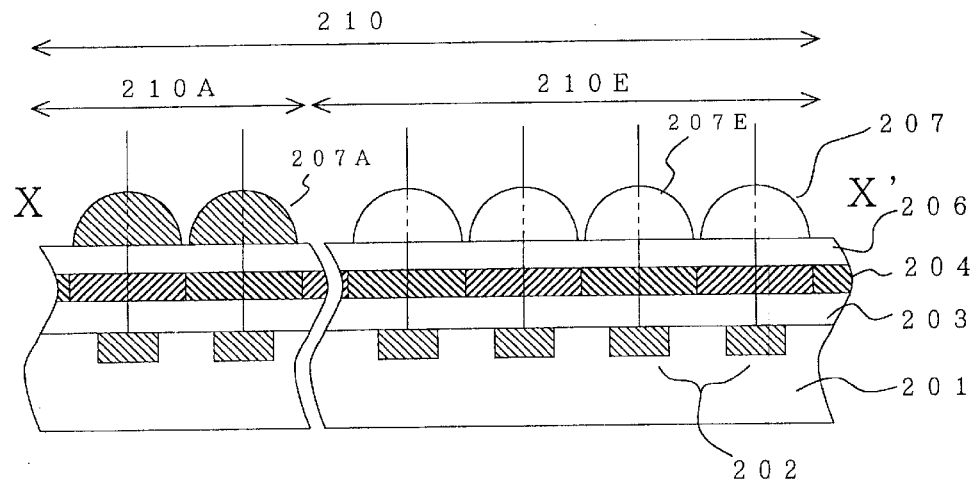
Fig.13
| G | R | G | R |
|---|---|---|---|
| B | G | B | G |
| G | R | G | R |
| B | G | B | G |
Fig.14
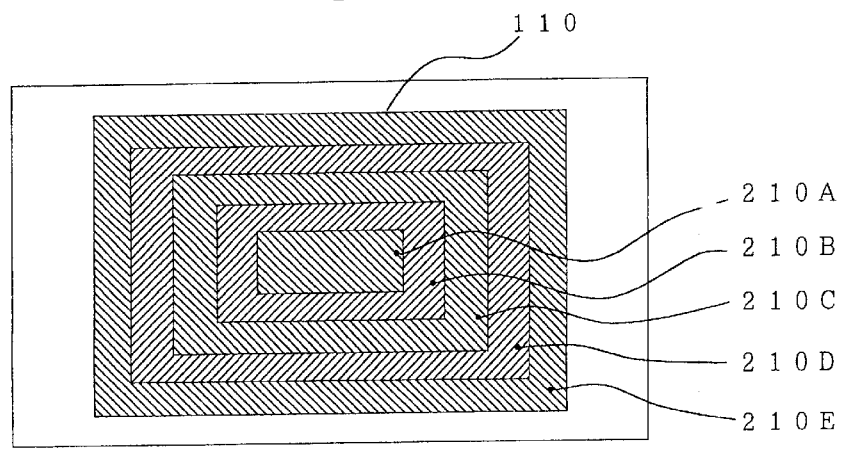

(a)

(d)

(b)

(e)

(c)

(a)

(b)

| G | R | G | R |
|---|---|---|---|
| B | G | B | G |
| G | R | G | R |
| B | G | B | G |

(a)

(b)

SOLID-STATE IMAGE SENSOR, PRODUCTION METHOD OF THE SAME, AND DIGITAL CAMERA

CROSS REFERENCE TO RELATED APPLICATION AND CLAIM FOR PRIORITY

This application is a division of Application Ser. No. 09/726,897; filed Nov. 30, 2000 U.S. Pat. No. 6,518,640 which is based upon Japanese Application Serial Nos. 11-343029 and 11-374383 filed Dec. 2, 1999 and Dec. 28, 1999, respectively, entitled "Solid-State Image Sensor, Production Method of the Same, and Digital Camera", the contents of which are incorporated herein by reference in their entirety. Priority is claimed accordingly from the foregoing patent applications.

BACKGROUND OF THE INVENTION

1. Field of the Invention

The present invention relates to a solid-state image sensor having a function of decreasing a shading amount, a production method for the solid-state image sensor, and a digital camera using the solid-state image sensor, and particularly to a solid-state image sensor wherein micro-lenses are placed on the photodetecting cells belonging to the incident side, the production method of the solid-state image sensor, and a digital camera using the solid-state image sensor.

2. Description of the Related Art

Recently, video cameras and digital cameras have become wide-spread in general. CCD-type or MOS-type solid-state image sensors are used in these cameras. In such solid-state image sensors, a plurality of photodetecting cells having a light-receiving part (a photoelectric converter) are arranged to form a matrix. The energy of the light incident to each photodetecting cell undergoes photoelectric conversion in the light-receiving part, generating a signal charge. The generated signal charge is outputted to the external parts, via a CCD and a signal channel.

As shown in FIG. 32, a CCD-type solid-state image sensor 10 of the related art has a photodetecting cell 13 having a light-receiving part 2, a vertical CCD 15 and a horizontal CCD 16 constituting the light-receiving part 2 for transferring signal charges, and an output amplifier 17.

Among the photodetecting cells placed in the light receiving area (the area to which the light is incident) of the solid-state image sensor 10, there are valid cells wherein the energy of the light, incident to the light-receiving part 2, undergoes a photoelectric conversion into a signal charge for outputting said signal charge, and there are photodetecting cells for outputting dark currents without photoelectric conversion.

A photodetecting cell which outputs dark currents is known, for instance as a black dummy. Such a photodetecting cell has an incident side which is shielded from the light, and is generally placed in one row and/or one column surrounding the valid cell area wherein a plurality of valid cells are arranged to form a matrix, or in a row at the extremity of any side of the valid cell area where a plurality of valid cells are arranged to form a matrix.

In addition, the solid-state image sensor 10 is equipped with a light-blocking layer such that the light is only incident to the light-receiving part 2 of the valid cells, and with signal driving channels for applying voltage to CCD electrodes, not shown in FIG. 32.

In addition, color filters are placed above each light-receiving part, for taking color pictures with the solid-state image sensor 10.

FIG. 33 is a layout view showing an example of an array of color filters. The plurality of color filters together forms a layer. R, G and B represent red, green and blue filters, respectively. One of the R, G or B filters is placed above the light-receiving part 2.

In addition, to improve the converging power, a micro-lens is sometimes placed above each light-receiving part 2. FIG. 34 is a cross-sectional view showing the structure of a photodetecting cell of the solid-state image sensor 10 of the related art.

In the above-mentioned solid-state image sensor 10, the light-receiving part 2 is formed on top of the semiconductor substrate 1 (for example a silicon substrate), a light blocking layer 9 with apertures 8 is placed on the incident side of the light-receiving part 2.

Above each light-receiving part 2, one of the R, G and B color filter 4 is placed in an on-chip fashion. In addition, a micro-lens 7 for improving the converging power is placed immediately above the light-receiving part 2, via a flattening layer 6.

In fact, in such a solid-state image sensor 10, a phenomenon called shading is known which gives rise to sensitivity fluctuations in the valid cell area.

Shading originates from the fact that incident lights incident to the peripheral part of the valid cell area, when compared to incident lights incident to the central part of the valid cell area, have incidences which are oblique. In other words, when the light is obliquely incident, it generates eclipses and a degradation of the photoelectric conversion rate at the level of the light-receiving part 2.

In this case, since the quantity of incident lights in the central part of the valid cell area is greater, for the same quantity of incident lights, the output signal is greater for the photodetecting cells of the central part when compared to the photodetecting cells of the peripheral part. Therefore, a "sensitivity fluctuation" is generated between the photodetecting cells of the central part and the photodetecting cells of the peripheral part. Also, in this document, the "sensitivity fluctuation (or the difference in the output value)" is called the shading amount. The shading amount increases when the number of photodetecting cells increases, and the size of the valid cell area increases.

FIG. 35 shows an example of results obtained when the shading amount is measured for a solid-state image sensor.

The measurements of the shading amount shown in FIG. 35 have been obtained by measuring the output of a valid cell area, whose size was 25.1 mm in the horizontal direction and 16.9 mm in the vertical direction.

In the drawing, Δ0 is the G output voltage of the central part (sensitivity, equivalent to the actual aperture rate), ● is the calculated value for the latter, X is the actual measurement of the G output voltage for the peripheral part, and □ is the calculated value of the latter.

From this figure, it is clear that the shading amount between the central part and the peripheral part depends on the F number of the digital camera, the result of which is displayed as the difference in the G output voltage (sensitivity).

A so-called "micro-lens positional offsetting" method, wherein the center of micro-lens belonging to the peripheral part is moved towards the central part of the valid cell area, taking the center of the corresponding light-receiving part as the reference, and a method wherein the aperture width of the light blocking layer is larger the closer to the periphery it is, taking the center of the corresponding light-receiving part as the reference, have been proposed as methods for decreasing such shading amounts.

Of these, the "micro-lens positional offsetting" is publicly known, for instance, as disclosed in Japanese patent No. 2600250.

In the "micro-lens positional offsetting", as shown in FIG. 36, the center of a micro-lens 27 installed above a light-receiving part (for example a photovoltaic such as a photodiode) 22, is matched with the center of a light-receiving part 22 (double-broken lines in the drawing) in case the light-receiving part belongs to the central part 21A of the valid cell area 21, and offset by a specified distance d1 towards the central part of the valid cell area 21, in case the light-receiving part belongs to the peripheral part 21E of the valid cell area.

The specified distance d1 is defined so it becomes greater at a constant rate, the further from the center 21X of the solid-state image sensor 20. In addition, optimal values are determined for the specified distance d1, taking into consideration the characteristics of the camera lenses and the solid-state image sensor 20 actually used. In addition, in the drawing, numeral 23 is an inter-level isolation layer, numeral 24 is a color filter and numeral 26 is a flattening layer.

The "micro-lens positional offsetting" shading countermeasure mentioned above has been recognized to be effective to some extent, but it is still not sufficient. The reasons are explained concretely in the following.

First, the above-mentioned shading countermeasure has the problem of not taking into account the solid-state image sensors wherein color filters are placed on the incident side, thereby generating color shading due to said color filters. Color shading designates the offset of color balance between the central part and the peripheral part.

Second, when applying the "micro-lens positional offsetting", which offsets the position of the lenses, to actually-made solid-state image sensors, it has not been possible to decrease the shading to the same extent as the values calculated in simulations. In addition, the aperture area of the light blocking layer mounted in the solid-state image sensor has not been taken into consideration. In other words, although when the aperture area of the light blocking layer is wider, the light leak increases and leads to such a problem as cross-talk, which is one of the effects due to shading, and a malfunction of switch transistors, these phenomena have not been taken into account in the "micro-lens positional offsetting".

Third, when designing in shading countermeasures, the characteristics of the digital camera, wherein the corresponding solid-state image sensor is applied, have not been taken into account. In other words, the F number of the camera lens equipped in digital cameras, and/or the actual F number change the angle of incidence of the light with respect to the light-receiving part, and this F number dependency of the incident angle influences the shading amount.

In the related art, taking into account this F number dependency of the shading amount, a correction to increase the brightness of the peripheral part by an image processing device installed in the camera side, has been considered (a software shading correction). This shading correction is performed as the step 1 of image processing (FIG. 37) executed by the computer of a digital camera carrying the solid-state image sensor 10. However, to execute the shading correction program, it is normally necessary to equip the digital camera side with a special control circuitry, which raises the costs. In addition, when the shading amount is large, by executing this shading correction, the efficiency of other processes requiring faithful color reproduction degrades and causes the problem of the image itself becoming unnatural. In addition, when the shading value is large, depending on the performance of the computer loaded onto the camera, rapid image processing can be difficult. The defect becomes a larger problem for CCD-type solid-state image sensors with an increased valid cell area.

In addition, the above-mentioned F number dependency of shading becomes particularly problematic, in the case of exchangeable lens-type digital still cameras, when the camera lens unit is substituted (when exchanging lenses).

Furthermore, the decrease in the shading amount by "micro-lens positional offsetting" is limited in the width of the offset, since it is a method wherein correction is made by offsetting the position of the micro-lens with respect to the position of the light-receiving part (photovoltaics). This is particularly a problem for large-size solid-state image sensors (film-size CCD-type solid-state image sensors) wherein the degree of oblique incidence is extremely large, and where not enough offset width can be maintained.

SUMMARY OF THE INVENTION

The present invention has been conceived in view of the above, and its first object is to provide a solid-state image sensor which can decrease even color shading, and/or a solid-state image sensor with superior shading effects, and a digital camera using such solid-state image sensor.

The second object of the present invention is to provide a solid-state image sensor which decreases shading independent from the aperture reserved at the light blocking layer, and/or a solid-state image sensor with superior shading effects, and digital camera using such solid-state image sensor.

In addition, the third object of the present invention is to provide a solid-state image sensor wherein the shading amount of a solid-state image sensor can be decreased while lowering the F number dependency, in a simple structure.

In addition, the fourth object of the present invention is to provide a solid-state image sensor wherein the shading amount of the solid-state image sensor can be decreased accurately in response to an actual environment of a digital camera taking pictures.

In order to achieve the above-mentioned objects, the solid-state image sensor of the present invention comprises a valid cell area wherein a plurality of light-receiving parts and a plurality of valid cells having color filters placed in an on-chip fashion corresponding to the light-receiving parts and outputting charge signals, are arranged to form a matrix, the color filters placed in the peripheral part of the valid cell area are offset with respect to the light-receiving parts in the direction to the center of the valid cell area, and the offset amounts between the color filters and aforementioned light-receiving parts become gradually or continuously larger, the further it is from the center and the closer it is to the periphery of the valid cell area. The above configuration makes it possible to appropriately offset the color filters with respect to the position of the light-receiving parts, and color mixture is decreased even when oblique incident light components are present.

Preferably, in the solid-state image sensor, the valid cell area is divided into groups of a plurality of concentric blocks, with the offset amount between the color filters and the light-receiving parts being the same within each block, and increasing from the central part to the peripheral part. The above configuration not only allows a decrease in color mixture, but also allows use of a relatively low-cost reticle as a reticle for making color filters when producing solid-state image sensors, and also decreases production costs.

In addition, another solid-state image sensor of the invention comprises a valid cell area wherein a plurality of light-receiving parts and a plurality of valid cells having color filters placed in an on-chip fashion to correspond to the light-receiving parts and outputting charge signals, are arranged to form a matrix, the color filters placed in the peripheral part of the valid cell area are offset with respect to the light-receiving parts in the direction to the center of the valid cell area, the light-receiving parts and the color filters are placed on a respective constant pitch, with the pitch for the light-receiving parts being greater than the pitch for the color filters. This configuration makes it possible to make the difference of the offset amounts between the color filters and the light-receiving parts continuous from the central part to the peripheral part of the valid cell area. Images obtained from such solid-state image sensors present more natural photographic subjects.

In addition, another solid-state image sensor of the present invention comprises a valid cell area, having a plurality of valid cells, each comprising a light receiving part and a light blocking layer in which apertures are provided corresponding to the light-receiving part, for outputting charge signals arranged to form a matrix, the apertures reserved at the peripheral part of the valid cell area are offset with respect to the light-receiving parts in the direction of the center of the valid cell area, and the offset amounts between the apertures and aforementioned light-receiving parts become gradually or continuously larger, the further it is from the center and the closer it is to the periphery of the valid cell area. The above configuration makes it possible to appropriately offset the apertures with respect to the position of the light-receiving parts, and the shading amount can be decreased without generating eclipses, even when oblique incident light components are present.

Preferably, the valid cells of the solid-state image sensor are divided into groups of a plurality of concentric blocks, with the offset amount between the apertures and the light-receiving parts being the same within each block, and the offset amounts being larger as it gets further from the central part and closer to the peripheral part. The above configuration not only allows a decrease in the shading amount, but it also allows use of a relatively low-cost reticle for making the apertures of a light blocking layer, and decreasing the production costs.

In addition, yet another solid-state image sensor of the present invention is equipped with a valid cell area wherein a plurality of light-receiving parts and a plurality of valid cells having a light blocking layer in which apertures are reserved to correspond to the light-receiving parts and outputting charge signals, are arranged to form a matrix, the apertures reserved at the peripheral part of the valid cell area are offset with respect to the light-receiving parts in the direction to the center, the light-receiving parts are placed and the apertures are reserved with a respective constant pitch, with the pitch for the light-receiving parts being greater than the pitch for the apertures. This configuration allows to make the difference of the offset amounts between the apertures of the light blocking layer and the light-receiving parts continuous from the central part to the peripheral part of the valid cell area, thus, the images obtained present more natural photographic subjects.

In addition, when considering the application of each of the above-mentioned solid-state image sensors of the present invention to digital cameras, the offset between the center of the light-receiving parts and the center of the micro-lenses equipping the incident side, the offset between the center of the light-receiving parts and the center of the color filter, and the offset between the center of the light-receiving parts and the center of the apertures can be determined based on the total thickness of layers, the thickness of the layer between the light-receiving parts and the layer equipped with the micro-lenses, the thickness of the layer between the light-receiving parts and the color filters, the thickness of the layer between the light-receiving parts and the apertures, the refractive index of the layer placed underneath the micro-lenses and the eye-relief of the optical system equipped in the digital camera.

In addition, yet another solid-state image sensor of the present invention has a valid cell area formed by a plurality of photodetecting cells made of a plurality of photovoltaics arrayed on the main side of a semiconductor substrate, in which, according to the position of the photovoltaics inside the valid cell area, on the light receiving side of the corresponding photovoltaic, a penetration adjusting device is placed to adjust the optical penetrating amount of the corresponding incident light. This allows proper reduction in the shading amount which differs according to the position of the valid cell area.

Preferably, the penetration adjusting device of the solid-state image sensor is a layer made of organic materials, formed in the upper part of the photovoltaics, which has different optical penetration amount according to the position inside the valid cell area. This allows, by only changing the optical penetrating rate of the layer made of organic material, composition for an optimal decrease of the shading amount without modification of other structures.

In addition, preferably, in the solid-state image sensor, micro-lenses are configured in the layer made of organic material, formed on the light receiving side of the photovoltaics, and have different optical penetrating rates depending on the position from the peripheral part to the central part of the valid cell area. This allows, by only changing the optical penetrating rate of the micro-lenses, in other words, without modification of other structures, composition for an optimal decrease of the shading amount.

In addition, preferably, in the solid-state image sensor, micro-lenses are placed on the light receiving side of the photovoltaics, with the layer made of organic material serving as the flattening layer formed between the photovoltaics and the micro-lenses. This allows, by only changing the optical penetrating rate of the flattening layer, in other words, without modification of other structures, composition for an optimal decrease of the shading amount.

When producing such solid-state image sensor, a layer is formed, wherein the optical penetrating rate changes according to the irradiation amount due to ultra-violet rays, and the layer is selectively exposed to ultra-violet rays in an amount which changes according to the position of the valid cell areas. This allows, by only adjusting the amount of ultra-violet irradiation occurring during the generally performed "added exposure", production of a solid-state image sensor with an optimal decrease of the shading amount.

In addition, preferably, a layer is formed wherein the optical penetrating rate changes according to the temperature of heating, and the layer is heat-treated, according to the position of the valid cell areas. This allows, by only adding a simple production process, production of a solid-state image sensor with an optimal decrease of the shading amount.

In addition, preferably, the penetration adjusting device is placed on the light receiving side of the valid cell area, and functions as an optical penetrating rate controlling device capable of controlling the optical penetrating rate. Fine control (decrease) of the shading amount is possible using the optical penetrating rate controlling device.

In addition, preferably, in the solid-state image sensor, the optical penetrating rate controlling device controls the optical penetration rate based on the signals from the brightness sensor mounted in the surrounding of the valid cell area. This allows for a proper and optimal decrease of the shading amount according to the actual environment of a digital camera taking pictures.

Solid-state image sensors configured as mentioned above are mounted into digital cameras. This allows for correction of the shading according to the environment of a digital camera taking pictures.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 11 is a table showing each parameter of a digital camera in relation to a fourth embodiment.

FIG. 12 is a cross-sectional view of a solid-state image sensor 200 of a fifth embodiment of the present invention.

FIG. 13 is a view showing the arrangement of a color filter 204 according to the Bayer array.

FIG. 14 is a planar view showing the layout of a block 210A, a block 210B, etc., of the solid-state image sensor 200.

Figure 1:
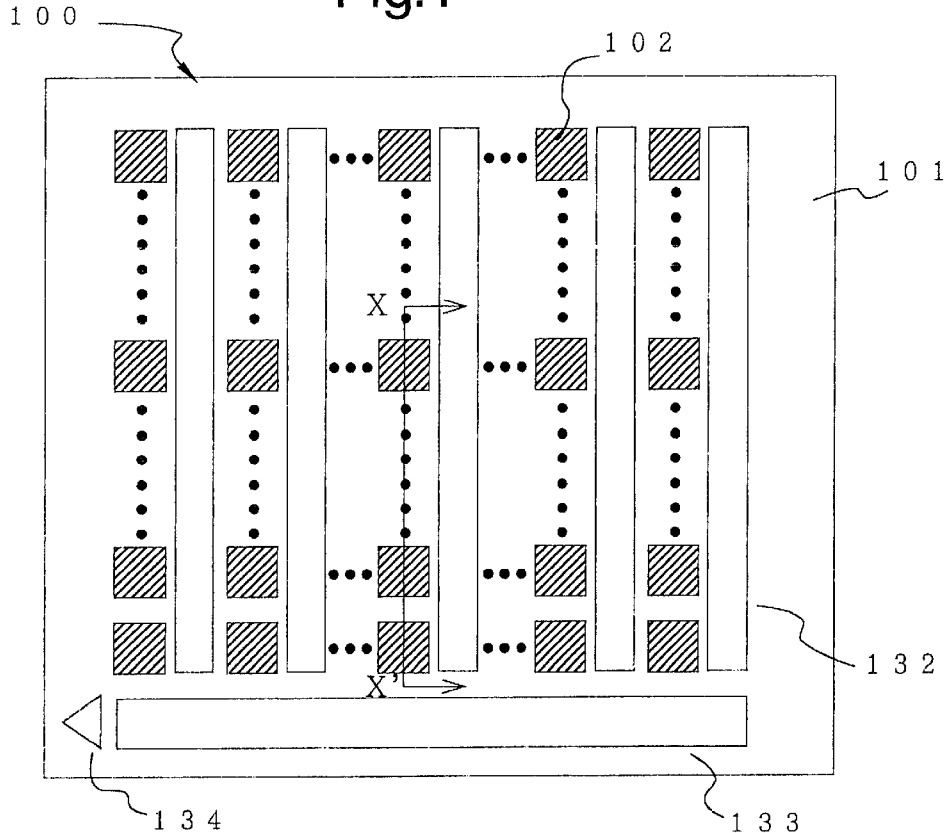
FIG. 1 is a planar view of a CCD-type solid-state image sensor 100 of the present invention.

DESCRIPTION OF THE PREFERRED EMBODIMENT (First Embodiment)

In the following, the first embodiment according to the invention will be explained referring to the drawings.

To begin with, the reasons which led the inventors to the invention of the first embodiment will be explained.

Figure 38:
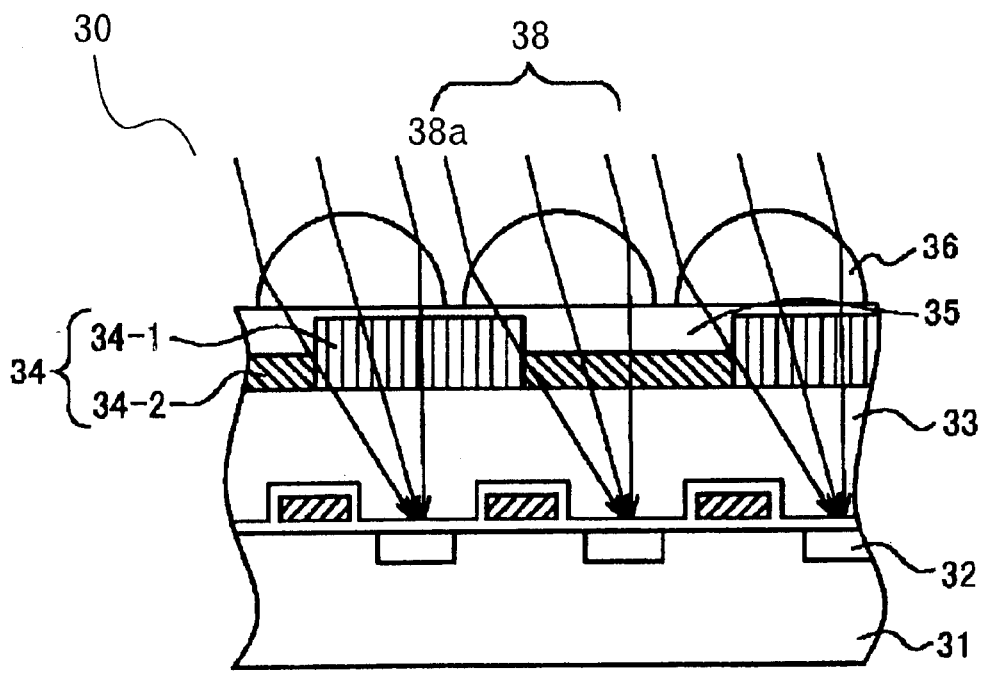
FIG. 38 shows the cross-sectional structure of the peripheral part of valid cell area of a solid-state image sensor 30 of the previous art, with (a) being a cross-sectional view for simplifying explanation and (b) being a cross-sectional view of a case where a more homogeneous control of the thickness of the color filter layer has been performed.
Figure 38:
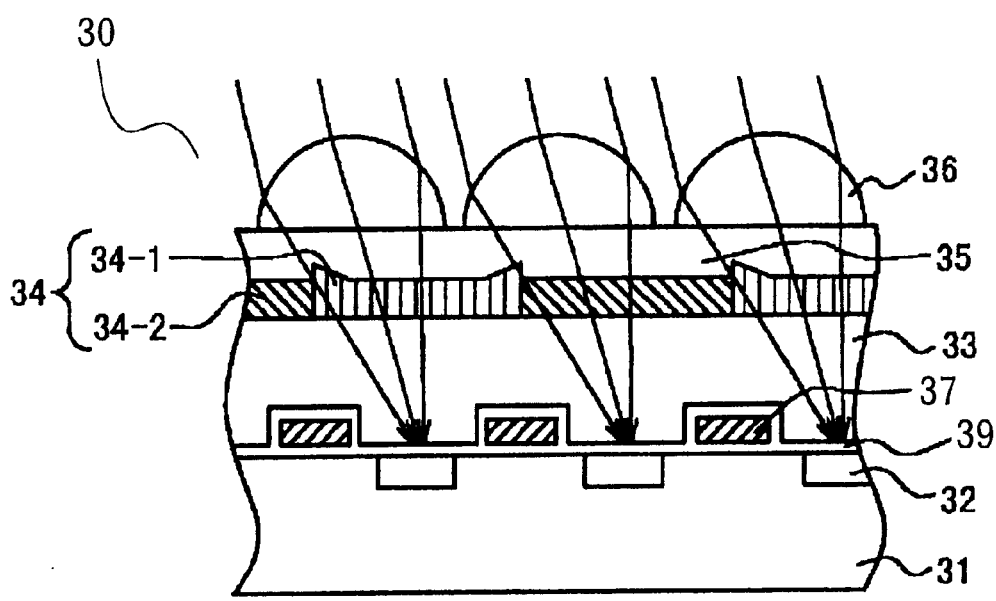

The inventors determined that the cause of the above-mentioned color shading (first problem) was attributable to color mixing due to the oblique incidence of the light. FIG. 38 is a cross-sectional view of the peripheral part of a valid cell area (the region where valid cells are arranged to form a matrix) of a solid-state image sensor 30 wherein the "micro-lens positional offsetting" has been applied.

In FIG. 38, (a) is a view for explaining and (b) is a view of a case where a more homogeneous control of the thickness of the color filter layer has been performed. In addition, here, the light blocking layer is omitted.

A light-receiving part 32 is placed above a semiconductor substrate (silicon substrate, for example) 31 and a micro-lens 36 is placed by offsetting the position with respect to the light-receiving part 32, to decrease shading. The micro-lens 36 is formed above a flattening layer 35. A CCD electrode 37 is placed between the light-receiving part 32 and the light-receiving part 32. A silicon-oxide layer 39 is placed to isolate the CCD electrode 37 and protect the light-receiving part 32.

A color filter 34 is formed above an inter-level isolation layer 33 by the spin-coating method, for each color. When produced as above, the thickness of the filter layer differs depending on the colors, and steps are generated. To give an example, in contrast to a thicker 2.5 μm thick color filter 34-1, a thinner color filter 34-2 would be about 1.2 μm thick.

When a step is generated between the color filters 34-1 and 34-2 which are different from each other, the light passes also through the color filter of the adjacent photodetecting cell, following the path indicated by numeral 38a.

This is the cause of color mixing. Color mixing is generated by the oblique incidence of the light, as above. However, the oblique incident light component decreases towards the central part of the valid cell area.

Therefore, between the central part and the peripheral part of the valid cell area, the degree of color mixing is different, and accordingly, the color balance also differs between the central part and the peripheral part of the valid cell area.

In addition, as in (b) of FIG. 38, for example, even if an ideal homogeneity of the thickness of the layer could be controlled, with the spin-coating method, the periphery of the filter formed afterwards is raised. Therefore, it is still a cause of color mixing.

The solid-state image sensor 100 of the first embodiment is configured such that the center of the color filters placed at the periphery of the valid cell area is offset with respect to the center of the light-receiving parts, in the direction of the center of the valid cell area, as described in detail below. This allows decrease of color shading due to the above causes.

A concrete explanation is given below.

Figure 2:
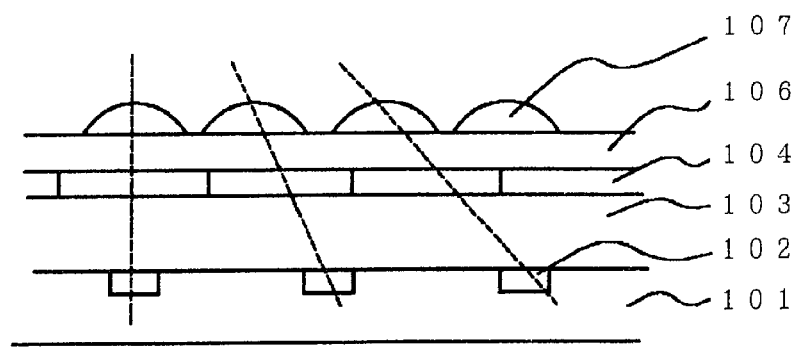
FIG. 2 is a cross-sectional view of the solid-state image sensor 100 in relation to a first embodiment of the present invention.

FIG. 1 is a planar view of a CCD-type solid-state image sensor 100 of the previous art, and FIG. 2 is a cross-sectional view showing the configuration of the photodetecting cell of the solid-state image sensor 100 in relation to a first embodiment of the present invention. In addition, in the solid-state image sensor 100 of FIG. 1, the pitch of a light-receiving part 102 is greater than the pitch of a color filter 104, offsetting the center of the color filter 104 with respect to the center of the light-receiving part 102. Furthermore, in FIG. 1 numeral 132 is a vertical CCD, numeral 133 is a horizontal CCD and numeral 134 is an output amplifier.

The light-receiving part 102 of the solid-state image sensor 100 is placed with a constant pitch at the top of a semiconductor substrate 101, as shown in FIG. 2. On top of these, via an inter-level isolation layer 103, a color filter 104 is placed in an on-chip fashion. The color filter 104 is also placed with a constant pitch, however, it is smaller than the pitch of the light-receiving part 102.

In this case, in the central part of the valid cell area wherein a plurality of valid cells are arranged to form a matrix, the center of the light-receiving part 102 of a photodetecting cell coincides with the center of the corresponding color filter 104. Then, at the level of each photodetecting cell, the offset amounts between the centers of the light-receiving parts 102 and the centers of the color filters 104 become gradually larger, the further it is from the central part, and the closer it is to the peripheral part.

Such a configuration allows decrease of color shading due to oblique incident lights, in the solid-state image sensor 100. In addition, the difference between the offset amounts between the center of the color filter 104 and the center of the light-receiving part 102 is gradual, from the position closer to the central part, to the position closer to the peripheral part of the valid cell area. This allows for images obtained from the solid-state image sensor 100 to present more natural photographic subjects.

In addition, in this case, a micro-lens 107 is placed above a flattening layer 106. The pitch of the micro-lens 107, when compared to the pitch of the color filter 104, is smaller. Such a configuration allows further decrease in the shading amount. In addition, the converging power of each photodetecting cell in the solid-state image sensor 100 is improved evenly.

In fact, FIG. 2 schematically shows the structure of the photodetecting cells in the central part and the photodetecting cells in the peripheral part of the valid cell area belonging to the solid-state image sensor 100. As shown in FIG. 2, in the peripheral part of the valid cell area, the micro-lens 107, the color filter 104 and the light-receiving part 102, drawn on top of the broken line, form one set corresponding to a configuration of one photodetecting cell.

For example, in the solid-state image sensor 100 of the first embodiment, the size of one side of the photodetecting cell is 10 μm, the size of the valid cell area is 24 mm×16 mm and the size of the light-receiving part 102 is 8 μm×4 μm.

In addition, the offset amount for the color filter 104 in the edge part of the valid cell area is designed to be 3 μm in the direction of the long side and 1 μm in the direction of the short side.

Figure 3:
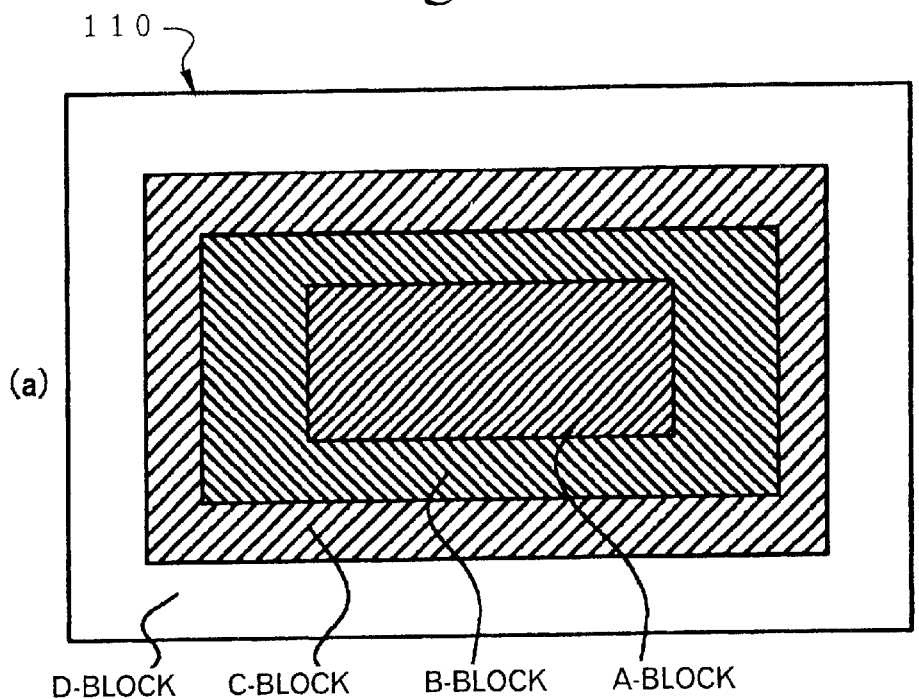
FIG. 3 shows the solid-state image sensor 100 in relation to a variation example of the first embodiment of the present invention, with (a) being a planar view and (b) being a cross-sectional view.
Figure 3:
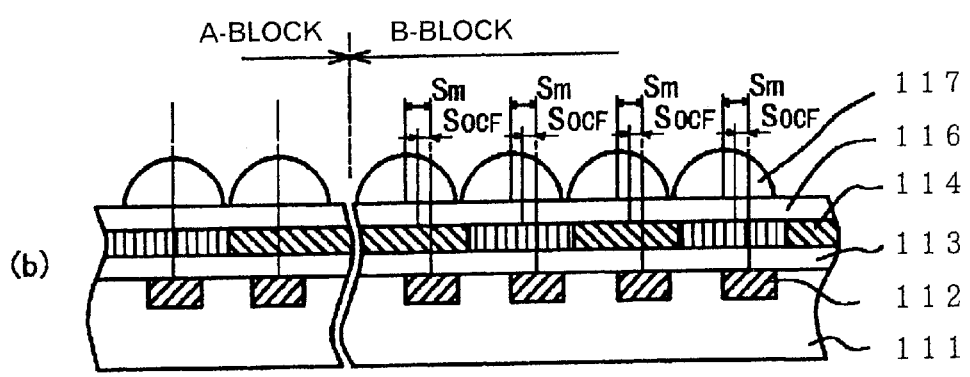

FIG. 3 is a figure for explaining the solid-state image sensor 100 in relation to a variation example of the first embodiment, wherein (a) is a planar view and (b) is a cross-sectional view.

In FIG. 3(a), an A block, a B block and a C block represent the valid cell area, and a D block represents an optically opaque part, or a peripheral circuit part.

The valid cell area is divided into concentric groups, from the central part to the peripheral part. In the central A block, the center of a light-receiving part 112 coincides with the center of a color filter 114 corresponding to the light-receiving part 112. On the other hand, in the photodetecting cell of the other blocks, the center of the color filter 114 is offset with respect to the center of the light-receiving part 112, in the direction of the center of the valid cell area. In addition, the offset amount (SOCF) is constant within each block, and is greater in the peripheral part. For example, it is greater in the B block than in the C block.

Such a configuration, as in the case of the solid-state image sensor 100 shown in FIG. 1 and FIG. 2, allows the offset amounts between the centers of the light-receiving parts 112 and the centers of the color filters 114 to become gradually larger, the further it is from the photodetecting cells in the center and the closer it is to the photodetecting cells in the periphery. This results in the decrease of color shading due to oblique incident lights. In this case, a micro-lens 117 is placed above a flattening layer 116. In addition, in FIG. 3(b), numeral 111 is a semiconductor substrate, numeral 113 is an inter-level isolation layer.

In this case, the center of the micro-lens 117 in the B and C blocks, as is the case for the color filter 114, is offset with respect to the center of the light-receiving part 112, in the direction of the center of the valid cell area. In addition, the offset amount (Sm) is constant within each block. In addition, the offset amount (Sm) is greater than SOCF, and the offset amount of the block closer to the peripheral part is greater. This allows not only a further decrease in the shading amount, but also improvement in the converging power.

The appropriate value for a concrete "offset amount" is different depending on the size of the cell, the thickness of each layer, and so forth. The "appropriate offset amount" is described below.

Figures 4, 5:
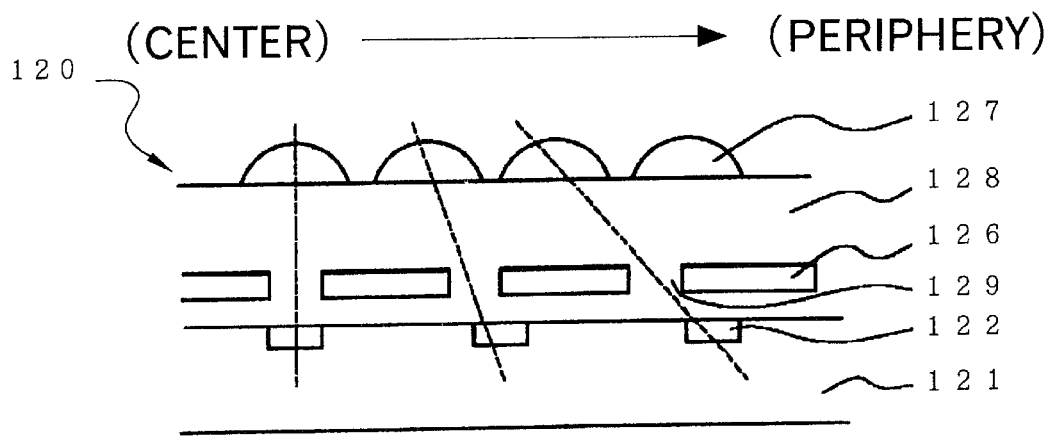
FIG. 4 is a table indicating the sizes and offset amounts for a solid-state image sensor 110, a variation example of the first embodiment.
FIG. 5 is a cross-sectional view of a solid-state image sensor 120 in relation to a second embodiment of the present invention.

An example of the sizes of the solid-state image sensor 100 of the current embodiment and offset amounts are shown in FIG. 4. The offset amount is different between the X direction and the Y direction, owing to a difference in the size of the valid cell area between the X direction and the Y direction.

In fact, semiconductor devices having the microscopic patterns that the solid-state image sensor 100 has, are produced using a photolithography apparatus called a stepper. The photolithography apparatus transfers the pattern of a reticle onto the top of a semiconductor substrate.

The reticle is obtained by patterning a layer of metal such as chrome on the top of a silicone glass plate. The cost is higher for reticles having finer microscopic patterns formed in the metal layer. A high-cost reticle is required to produce a solid-state image sensor.

As described above, in the solid-state image sensor, differentiating the pitch of the color filters or the pitch of the micro-lenses from the pitch of the light-receiving parts (as in the case of the solid-state image sensor of FIG. 2), involves changing SOCF or Sm by a minute amount (in the order of 0.01 μm) for each photodetecting cell.

If a characteristic of the solid-state image sensor (for example, color reproducibility) is important, the offset amount between the color filter and the light-receiving part can be made so that the difference in offset amounts according to different positions is continuous from the central part to the peripheral part of the valid cell area. In this case, however, an even higher cost reticle is required.

In contrast, if the offset amount is different for each block as in the case of the solid-state image sensor 110 shown in FIG. 3, a comparatively rough accuracy of the pattern on the reticle is acceptable. Therefore, a low-cost reticle can be used, which decreases the production cost.

In either case, it is possible to decrease the color shading, with the solid-state image sensor 100 or 110 of the embodiment. Either configuration may be selected according to the objective for the use of the solid-state image sensor or the degree of freedom in the design and development.

(Second Embodiment)

In the following, the second embodiment according to the invention will be explained using FIG. 5.

The inventors determined the cause of the problem (the second problem, i.e. the eclipse) wherein the shading amount differs depending on the shape of the aperture reserved at the light blocking layer.

Figure 39:
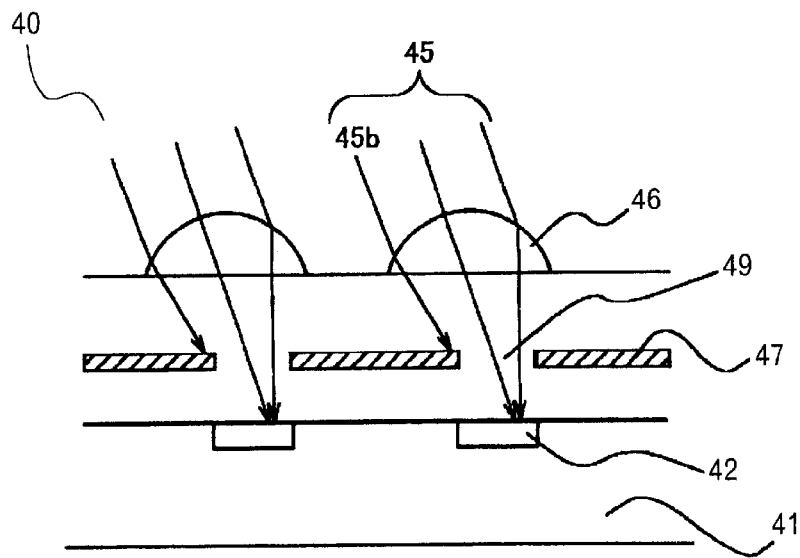
FIG. 39 is a cross-sectional view of the peripheral part of valid cells belonging to a solid-state image sensor 40 of the previous art.

This is explained below. FIG. 39 is a cross-sectional view of the peripheral part of the valid cell area belonging to a solid-state image sensor 40 of the previous art. Also, the color filter is omitted.

The "micro-lens positional offsetting" is applied to the solid-state image sensor 40, so that the center of a micro-lens 46 is placed to be offset with respect to the center of a light-receiving part 42 taken as the reference. In addition, in the drawing, numeral 41 is a semiconductor substrate.

As it is clear from the Figure, even if the center of the micro-lens 46 is offset with respect to the center of the light-receiving part 42, if an aperture 49 of a light blocking layer 47 is reserved immediately above the light-receiving part 42, an oblique incident light 45b is generated, blocked by the light blocking layer 47. This is why, it was not possible to decrease the shading amount as effectively as the simulations.

In a solid-state image sensor 120 of the second embodiment, the center of the aperture in the peripheral part of the valid cell area is offset with respect to the center of the light-receiving part, in the direction of the center of the valid cells. This configuration makes it possible to decrease the shading amount due to the above-mentioned cause.

A concrete explanation is given below.

FIG. 5 is a cross-sectional view showing the structure of the solid-state image sensor 120 in relation to the second embodiment of the present invention.

In the solid-state image sensor 120, by increasing the pitch of a light-receiving part 122 to be greater than the pitch of an aperture 129 of a light blocking layer 126 (simply called aperture, hereafter), the center of the aperture 129 is offset with respect to the center of the light-receiving part 122.

In other words, the light-receiving part 122 is placed with a constant pitch on top of a semiconductor substrate 121. Above these, the light blocking layer 126 containing the aperture 129 is placed via an inter-level isolation layer 128. The aperture 129 is also reserved with a given constant pitch which is smaller than the pitch of the light-receiving part 122. In addition, in the drawing, numeral 127 is a micro-lens.

In this case, in a photodetecting cell belonging to the center part belonging of the valid cell area, the center of the light-receiving part 122 coincides with the center of the corresponding aperture 129. This allows the offset amounts between the apertures 129 and the light-receiving parts 122 to gradually become larger, the further it is from the photodetecting cells of the central part and the closer it is to the photodetecting cells of the peripheral part. This results in a further decrease of the shading amount due to oblique incident lights. In addition, the offset amounts between the center parts of apertures 129 and the centers of the light-receiving parts 122 are continuously different from the central part to the peripheral part of the valid cell area, allowing for obtained images to present photographic subjects more naturally.

In addition, in the embodiment, the micro-lens 127 is placed on above the inter-level isolation layer 128. Also, the pitch of the micro-lens 127, when compared to the pitch of the aperture 129, is smaller. As a result of this, not only is the shading amount further decreased, but the converging power is also improved. In addition, the micro-lens 127, the aperture 129 and the light-receiving part 122, drawn on top of a broken line in FIG. 5, form one set corresponding to the configuration of one photodetecting cell.

In addition, in the embodiment, by changing the pitch of the light-receiving part 122 and the pitch of the aperture 129, the shading amount is decreased. However, the above does not constitute a limitation, and it is also acceptable to divide the valid cell area into groups, as shown in the variation example of the first embodiment, offset the aperture 129 with respect to the light-receiving part 122 in the direction of the center of the valid cell area, and make the offset amount (SOPN) constant for each block. In this case, it suffices to make the offset amount between the center of the light-receiving part and the center of the aperture, within the block of the peripheral part, greater than the offset amount in the central part. If the offset amount is defined block by block as above, when forming the aperture of the light blocking layer, a low-cost reticle can be used, which decreases the production cost for the solid-state image sensor.

(Third Embodiment)

In the following, the third embodiment according to the invention will be explained.

Figure 6:
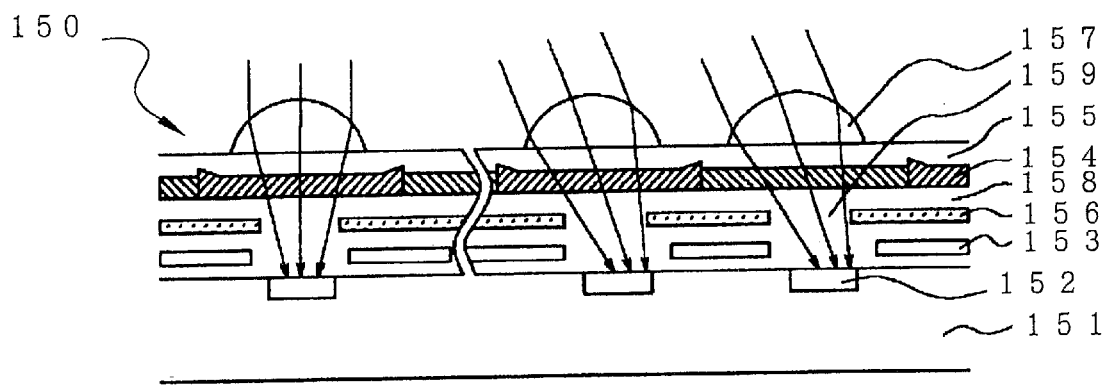
FIG. 6 is a cross-sectional view of a solid-state image sensor 150 in relation to a third embodiment of the present invention.

FIG. 6 is a cross-sectional view showing the configuration of a solid-state image sensor 150 in relation to a third embodiment of the present invention.

In addition, the planar layout of the solid-state image sensor 150 is almost identical to the layout shown in FIG. 3(a). In other words, the valid cell area is divided into an A block, a B block and a C block (a D block represents an optically opaque part, or a peripheral circuit part).

In this case, each photodetecting cell of the solid-state image sensor, forms a light-receiving part 152 on top of a semiconductor substrate (a silicone plate) 151, and an aperture 159 of a light blocking layer 156, a color filter 154 and a micro-lens 157 are placed, corresponding to the light-receiving part 152.

In the central A block, the center of the light-receiving part 152 coincides with each of the center of the aperture 159, the center of the color filter 154 and the center of the micro-lens 157, corresponding to the light-receiving part 152.

On the other hand, at the level of the photodetecting cells of the other blocks, each of the center of the aperture 159, the center of the color filter 154, and the center of the micro-lens 157 is offset with respect to the center of the light-receiving part 152, in the direction of the central part of the valid cell area.

The offset amounts (sequentially, SOPN, SOCF and Sm) for each photodetecting cell, are constant for the photodetecting cells contained in the same block, and are greater for photodetecting cell of a block close to the peripheral part. In addition, each offset amount for a photodetecting cell, which is constant for each block, is related by SOPN SOCF Sm.

The above makes it possible for the offset amounts to become gradually larger with respect to the light-receiving parts 152 of each of the centers of the apertures 159, the centers of the color filters 154 and the centers of the micro-lenses 157, in photodetecting cells, the further they are from the central part and the closer they are to the peripheral part. Therefore, the shading and the shading amounts due to oblique incident lights are decreased.

Here, a method for determining the "appropriate offset amount" with respect to a light-receiving part, for the aperture, the color filter and the micro-lens, will be explained referring to FIG. 7 and FIG. 8.

Figure 7:
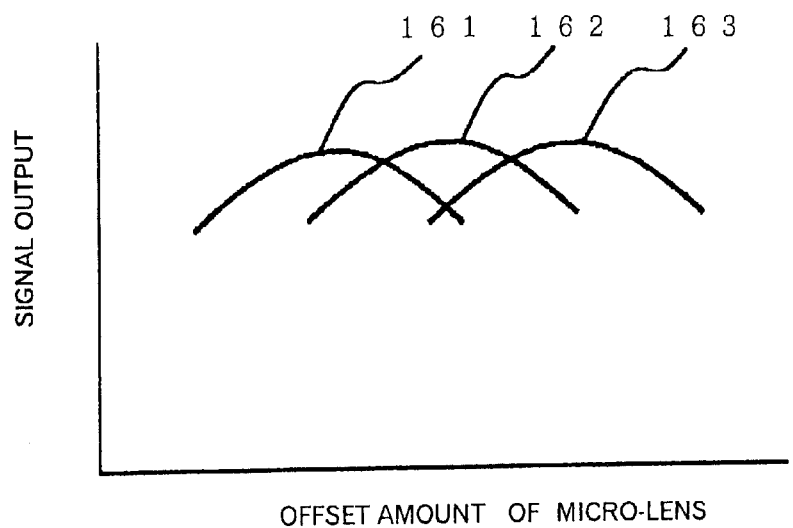
FIG. 7 is a measurement graph relating offset amount (Sm) between a light-receiving part and a micro-lens, and the signal output from the photodetecting cell, when the interval between the light-receiving part and the micro-lens is varied.

FIG. 7 is a measurement graph relating the "offset amount (Sm)" between a light-receiving part and a micro-lens, and the signal output from the photodetecting cell, when the interval between the center of the light-receiving part and the center of the micro-lens is varied.

The horizontal axis is the "offset amount" of the micro-lens with respect to the corresponding light-receiving part, and the vertical axis is the output voltage. In addition, in this case, the position of the aperture of the light blocking layer coincides with position of the color filter, and the "offset amount" of the micro-lens as well as the thickness of the flattening layer placed immediately underneath the micro-lens are varied. In other words, the distance between the light-receiving part and the micro-lens is varied.

The thickness of the flattening layer is larger in the order of 161, 162 and 163.

As is clear from the figure, an appropriate value (or range) to decrease the shading exists for the "offset amount" of a micro-lens, and it is revealed that the "appropriate offset amount" is larger corresponding to the distance between the micro-lens and the light-receiving part being larger. FIG. 7 is the data on the offset amount of the micro-lens.

However, if an appropriate value exists for the "offset amount" of a micro-lens, similarly, an "appropriate offset amount" should also exist for the aperture of a light blocking layer, or a color filter.

Therefore, based on the above-mentioned results, a number of assumptions were made, leading to each "appropriate offset amount".

Figure 8:
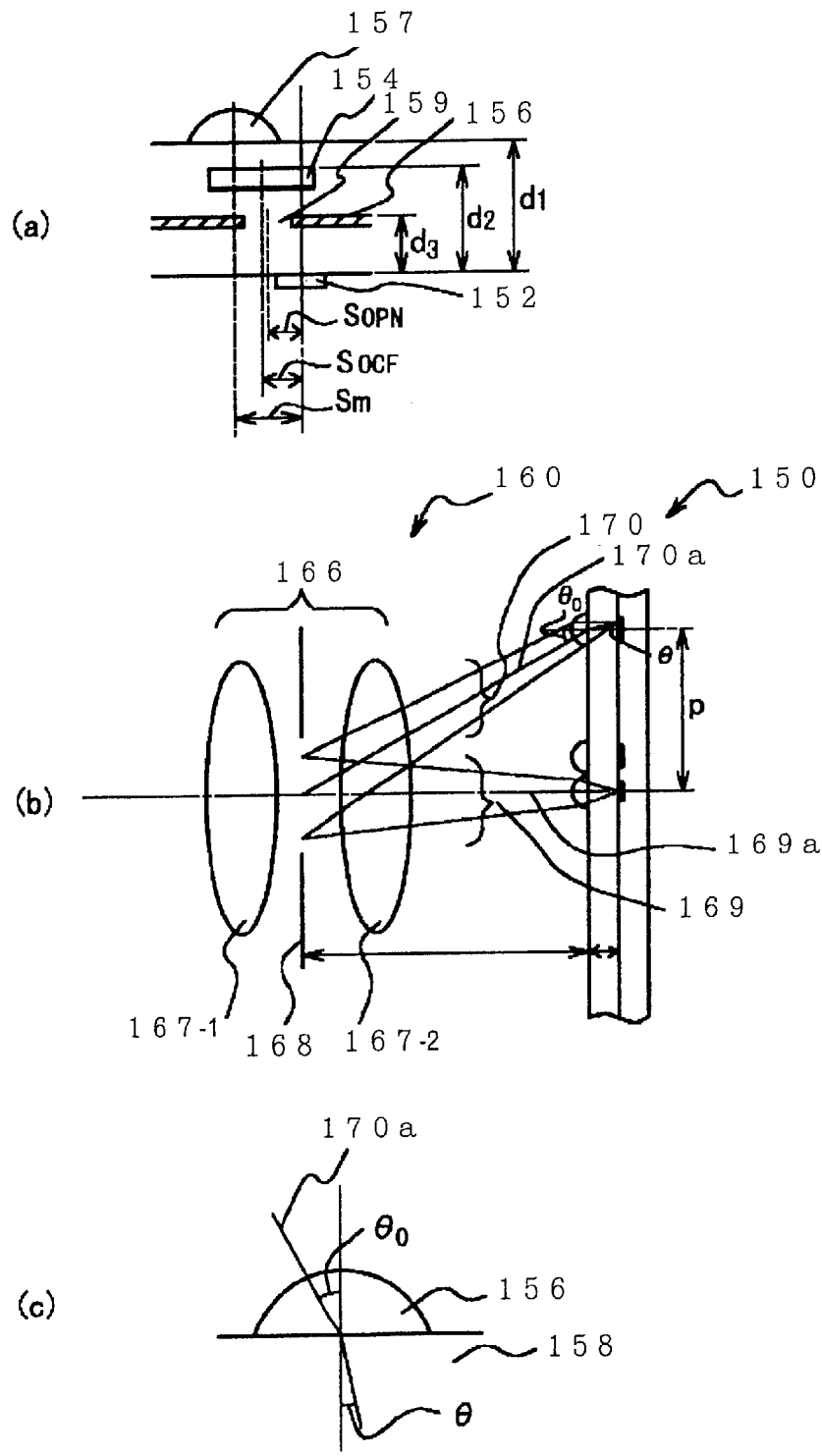
FIG. 8 is a Figure for explaining the parameters required to calculate the "appropriate offset amount", wherein (a) is a cross-sectional view showing the configuration of a photodetecting cell of the solid-state image sensor 150, (b) is a view showing the substantial part of a digital camera loaded with the previous element, and (c) is a magnified view of the surroundings of the micro-lens.

FIG. 8 is a drawing for explaining the parameters required to calculate the "appropriate offset amount", wherein (a) is a cross-sectional view of the solid-state image sensor 150 of the invention, (b) is a view showing the substantial part of a digital camera 160 loaded with the solid-state image sensor 150, and (c) is a magnified view of the surroundings of the micro-lens.

In FIG. 8, SOPN, SOCF and Sm are the "offset amounts" with respect to the light-receiving part 152 for each of the center of the aperture 159, the center of the color filter 154 and the center of the micro-lens 157, respectively.

In addition, d3, d2 and d1 are the distances from the upper side of the light-receiving part 152 to each of the upper side of the aperture 159, the upper side of the color filter 154, and the upper side of the micro-lens 157, respectively.

In addition, as shown in FIG. 8(b), the digital camera 160, wherein the above-mentioned solid-state image sensor 150 is applied, has an optical system 166, wherein a lens 167 and an iris 168 are placed. In addition, an optical system is shown in the drawing, having a two lens set of numeral 167-1 and numeral 167-2, but this does not constitute a limitation.

The light becomes incident to the solid-state image sensor 150, via the optical system 166.

Incident lights 169 have an almost perpendicular incidence in the central part of the valid cell area. On the other hand, in the peripheral part, incident lights 20 have an incidence other than a right angle.

In this case, P, indicated in FIG. 8(*b*), is the distance between the center of the valid cell area and the photodetecting cell for which the "appropriate offset amount" is calculated (generally called "height of the image"), and l is the distance between the light receiving side of the solid-state image sensor 150 and the iris 168 (generally called "eye-relief").

The "appropriate offset amount" is sought with a number of assumptions.

First, the "appropriate offset amount" is calculated taking the rays incident to the center of each micro-lens (169*a*, 170*a*; to simplify, will be called θ0 rays, hereafter), as the reference.

The light passing through the optical system 166 of the digital camera 160, actually has a certain spread centered around the incident light which passed through the center of the micro-lens at the level of the height of the image P, which is clear from FIG. 8(*b*). The light having the aforementioned spread, becomes incident to the micro-lens of the solid-state image sensor, and exits to the light-receiving part. Therefore, by simulating each condition for taking a picture, for example, the converging condition by micro-lenses, of a light flux wherein the spread depends on the F number of the camera lens system, an accurate calculation of an "optimal offset amount" is possible, according to the characteristics of actually mounted micro-lenses and color filters, and actually reserved apertures of light blocking layers.

Here θ0 rays are used as the reference. This makes it possible to consider the camera lens and easily calculate the "optimal offset amount" according to the characteristics of the micro-lens, color filter or aperture of a light blocking layer.

Second, each type of layer between the micro-lens and the light-receiving part is assumed to have the same refractive index as the refractive index n of the layer immediately below the micro-lens. Then, the incident angle θ0 and the exit angle θ0 of the micro-lens are determined by the angle of the first refraction after the θ0 rays have arrived on the solid-state image sensor, as shown in FIG. 8(*c*).

In reality, in the solid-state image sensor, between the micro-lens and the light receiving part, a plurality of layers are formed such as the flattening layer, the color filter, the insulation layer, the oxide layer. Therefore, strictly, since the refraction index of each layer is different, the incident light is refracted in a complex manner at the level of each layer. However, the difference in the indices being generally small, they are assumed to be constant (refraction index n), as described above. Following this assumption, the relationship between the incident angle θ0, the exit angle θ and the refraction index n, is expressed in the following equation, according to Snell's law:

$$\sin\theta = \sin\theta 0 / n \tag{1}$$

Third, although the incident lights output from the camera lens system are to first become incident to the micro-lenses, whether there are micro-lenses or not, the θ0 rays are assumed to arrive on the light-receiving part the via the same route. Therefore, the "appropriate offset amount" calculated here is applicable to solid-state image sensor without micro-lenses.

In addition, measurement of the exit angle θ from the micro-lens is difficult in reality. Therefore, the incident angle θ0 at the micro-lens is defined by the following equation, using the height of the image P, the eye-relief L, the equation have being an approximation, obtained by taking into consideration geometrical considerations.

$$\sin\theta 0 = P/(P^2 + l^2)^{1/2} \tag{2}$$

From equations (1) and (2), the exit angle is approximated by $\sin\theta = P/[n \times (P^2 + l^2)^{1/2}]$ and the exit angle is defined here by the previous equation.

With the above-described approximation, the optimal values of Sm, SOCF and SOPN, i.e., the offset amounts with respect to the light-receiving part for micro-lens, color filter and aperture, are calculated with the following equations, as a function of the distance from the light-receiving part and the exit angle θ.

$$Sm = d1 \times \tan\theta \tag{3}$$

$$SOCF = d2 \times \tan\theta \tag{4}$$

$$SOPN = d3 \times \tan\theta \tag{5}$$

It is mostly preferred to use the above-mentioned equations in order to calculate all of the "appropriate offset amounts" Sm, SOCF and SOPN, of the photodetecting cell of the valid cell area belonging to the solid-state image sensor. However, even if not all of the Sm, SOCF and SOPN, are set to the values of the above equations, in other words, even if one of the offset amounts Sm, SOCF and SOPN, is set to a value calculated using the above equation, there will be an effect on the decrease in the shading amount.

Also, these "appropriate offset amounts" are theoretical values obtained by approximation, based on the above-mentioned equation. Because of errors in the accuracy of the semiconductor manufacturing technique, actually produced solid-state image sensors are not always produced exactly by offsetting micro-lenses, color filters and apertures only by the "appropriate offset amounts" obtained from the equations (3), (4) and (5). Therefore, "appropriate offset amounts" having the optimal values of the above equations provided with a certain width, are preferred. According to the experiments, it is possible to provide the "appropriate offset amounts" with a width of ±30%. Therefore, the "appropriate offset amounts" are calculated using the equations (6), (7) and (8), with the condition of satisfying the relation SOCF<SOPN<Sm.

$$0.7 \times d1 \times \tan\theta \leq Sm \leq 1.3 \times d1 \times \tan\theta \tag{6}$$

$$0.7 \times d2 \times \tan\theta \leq SOCF \leq 1.3 \times d2 \times \tan\theta \tag{7}$$

$$0.7 \times d3 \times \tan\theta \leq SOPN \leq 1.3 \times d3 \times \tan\theta \tag{8}$$

Even if not all of the Sm, SOCF and SOPN, are not set to values in the ranges of the above equations, in other words, even if only one of the offset amounts Sm, SOCF and SOPN, is set to a value in the ranges of the above equation, there will be an effect on the decrease in the shading amount.

In addition, if the "offset amounts" are to be changed for each block as in the case of the solid-state image sensor 110 shown in FIG. 3, it suffices for the mean value of the offset amounts of each block to fall within the ranges of the optimal values obtained with the above equations. This also makes it possible to achieve a decrease of the shading.

Here, it is clear that, focussing on equation (3) and equation (4), the optimal ratio between Sm and SOCF is given by the ratio between d1 and d2, and focussing on equation (3) and equation (4), the optimal ratio between Sm and SOPN is given by the ratio between d1 and d3. The equations for calculating the optimal ratio are shown in (9) and (10).

$$Sm/SOCF = d1/d2 \quad (9)$$

$$Sm/SOPN = d1/d3 \quad (10)$$

In addition, if a width of ±30% is to be provided, the appropriate ranges of ratio expressed by the above equations (9) and (10) are calculated with the equations (11) and (12) below, provided with the width of ±30%.

$$0.7 \times (d1/d2) \leq Sm/SOCF \leq 1.3 \times (d1/d2) \quad (11)$$

$$0.7 \times (d1/d3) \leq Sm/SOPN \leq 1.3 \times (d1/d3) \quad (12)$$

Also in this case, even if the actually manufactured solid-state image sensor does not satisfy the conditions of both equations (11) and (12), if the ratio of at least one of the above equations is satisfied, there will be an effect on the decrease in the shading amount.

In addition, if the offset amounts are to be changed for each block as in the case of the solid-state image sensor 110 shown in FIG. 3, it suffices for the mean value of the offset amounts of each block to fall within the ranges of the optimal values obtained with the above equations.

Figure 9:
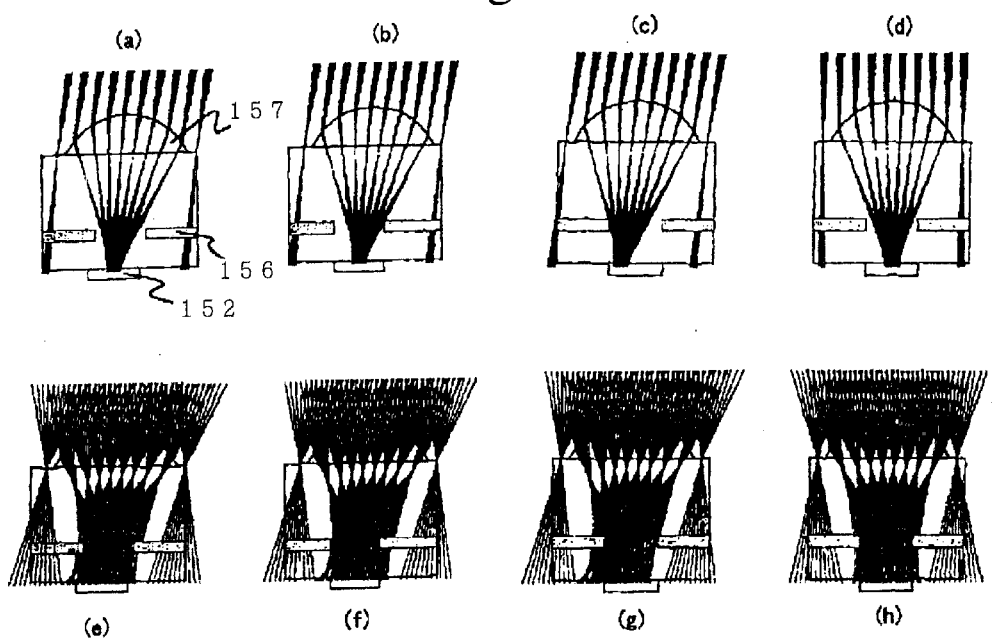
FIG. 9 is a cross-sectional view showing the light paths obtained when simulating how the light converges at the level of each of the photodetecting cells placed in the central part and in the peripheral part of the valid cell area belonging to the solid-state image sensor 150.

FIG. 9 is a cross-sectional view obtained by simulation, showing how the light converges in a photodetecting cell of the central part, and how the light converges in a photodetecting cell of the peripheral part, of the valid cell area belonging to a solid-state image sensor.

The upper part is the light path of the incident light when the F number of the lens of the optical system placed on the digital camera is 1.4, and the lower part is the light path of the incident light when the F number of the lens of the optical system placed on the digital camera is 11. In the drawing, (a) and (e) are photodetecting cells wherein the micro-lens and the aperture have been offset by the "appropriate offset amounts" for photodetecting cells of the peripheral part, given by the above-mentioned equations (6) and (8). In addition, (b) and (f) in the drawing are photodetecting cells in which only the micro-lens has been similarly offset by the "appropriate offset amount", (c) and (g) in the drawing are comparative examples wherein neither have been offset, and (d) and (h) in the drawing are photodetecting cells of the center.

In the above simulation, the size of the photodetecting cell was 10 μm×10 μm, the thickness of the micro-lenses was 2.5 μm, the size of the aperture of the light blocking layer and the size of the light-receiving part was 8 μm in the horizontal direction and 4 μm in the vertical direction. In addition, the values for d1, d2 and d3 (Ref. FIG. 8(a)) were 7 μm, 5.5 μm and 2.5 μm, respectively.

In addition, the offset amount for the micro-lenses of the photodetecting cells of the peripheral part was 0.8 μm in the horizontal direction and 0.6 μm in the vertical direction, in the direction of the center of the image-sensing side. In the photodetecting cells of the peripheral part, the center of the aperture of the light blocking layer was offset by only 0.4 μm (offset amount) in the horizontal direction and 0.3 μm (offset amount) in the vertical direction, in the direction of the center of the valid cell area.

When the micro-lenses are offset with respect to the light-receiving part, since the light converges in the center of the light-receiving part, there is an effect on the decrease in the shading amount (FIGS. 9(b) and (f)).

In addition, the existence of light components eclipsed by the light blocking layer can be seen. When the light blocking layer is further offset, the incident lights are adequately incident to the light-receiving part, and the shading amount is further decreased (FIGS. 9(a) and (e)).

In other words, also from this simulation, it can be seen that, in the photodetecting cells of the peripheral part, by offsetting the position of the micro-lens in the direction of the center of the valid cell area, and by further offsetting the aperture of the light blocking layer adequately with respect to the above offset micro-lens, obliquely incident lights pass through the center of the aperture of the light blocking layer and converge efficiently onto the light-receiving part.

Figure 10:
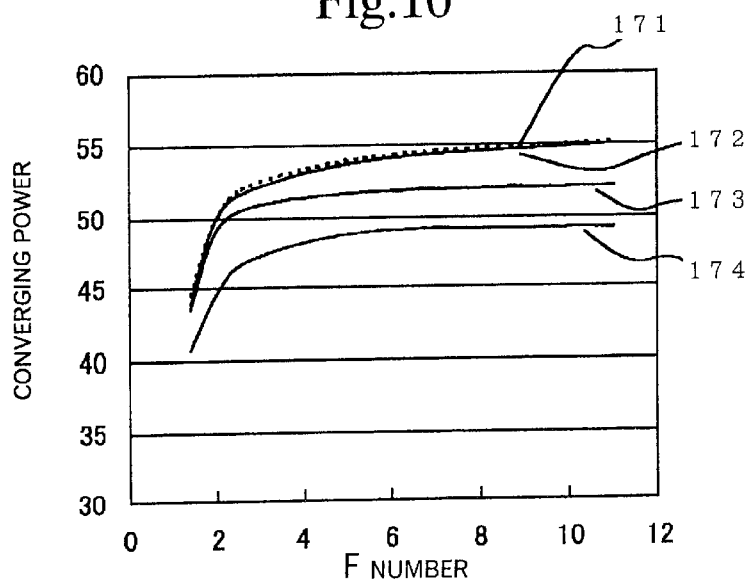
FIG. 10 is a graph showing the relationship between the F number of the optical system of a digital camera loaded with a solid-state image sensor and the converging power.

FIG. 10 is a graph showing the relationship between the F number of the lens used in the optical system of a digital camera, and the converging power of a solid-state image sensor.

The relationship between the converging power and the F number is shown by a dotted line 171 for the photodetecting cells of the central part of a valid cell area (FIGS. 9(d) and (h)), by a solid line 172 for the photodetecting cells in the peripheral part wherein the micro-lens and the aperture have been offset to their respective appropriate position ((a) and (e)), by a solid line 173 for the photodetecting cell of the peripheral part wherein only the micro-lens has been offset to the appropriate position, and by a solid line 174 for the photodetecting cells of the peripheral part, wherein neither the micro-lens nor the aperture have been offset.

As can be seen also from this graph, the shading is improved even when "positional offsetting" with respect to the light-receiving part is performed only for the micro-lens, but the shading amount is further decreased, by adequately performing a further "positional offsetting" of the aperture of the light blocking layer.

In addition, here, a configuration wherein the micro-lens and the aperture of the light blocking layer are offset with respect to the light-receiving part have been explained as an example. However, equivalent simulation results have been obtained when the "positional offsetting" was performed not only for the micro-lenses and the apertures, but also for the color filters. In addition, with this configuration, a further decrease in the color shading can be achieved.

(Fourth Embodiment)

The fourth embodiment according to the invention will be explained in the following. FIG. 11 is a table showing each parameter of a digital camera in relation to a fourth embodiment according to the present invention.

Not shown in the drawing, in the solid-state image sensor loaded on the embodiment, similarly to the solid-state image sensor 100 of the first embodiment, the pitch of the light-receiving part, and the pitch of each of the micro-lens, the color filter, and the aperture are varied.

The pitch of the light-receiving part is set uniquely by the number of photodetecting cells which is dictated by the resolution power required for the solid-state image sensor and the size of the solid-state image sensor.

For example, if the size of the valid cell area is 24 mm in the X direction, and 1000 photodetecting cells are aligned in the X direction, the pitch of the light receiving part is 24 μm.

In the embodiment, in order to obtain the pitch for each micro-lens, color filter and aperture, the "offset amounts" for the outermost part of the valid cell area are first obtained based on the previously explained equations (3), (4) and (5). Then, the pitch for the aperture is calculated from these "offset amounts".

In fact, the "optimal offset amounts" obtained from equations (3), (4) and (5) do not necessarily change linearly from the central part to the peripheral part of the valid cell area. In such a case where the change is not linear, with the configuration of the embodiment, a deviation from the "appropriate offset amount" may occur for photodetecting cells in an area other than the outermost part. In FIG. 11, the "optimal offset amounts" calculated from equations (3), (4) and (5) are listed together with the actual offset amounts arising from the above-mentioned pitch. In addition, the actual offset amount was obtained from the equation below.

$$S = (S \text{ of the outermost photodetecting cell}) \times [p/(p \text{ of the outermost photodetecting cell})]$$

From FIG. 11, it is clear that both "offset amounts" are almost the same. However, in this case, the calculation is performed with p Max=15 mm.

The reason for the above-mentioned match is due to the fact that, as the height of the image decreases, the inclination θ of incident lights inside the solid-state image sensor decreases, and the approximation sin θ≈ tan θ≈p/l becomes applicable.

(Fifth Embodiment)

In the following, the fifth embodiment according to the invention will be explained referring to FIG. 12 to FIG. 21.

Figure 40:
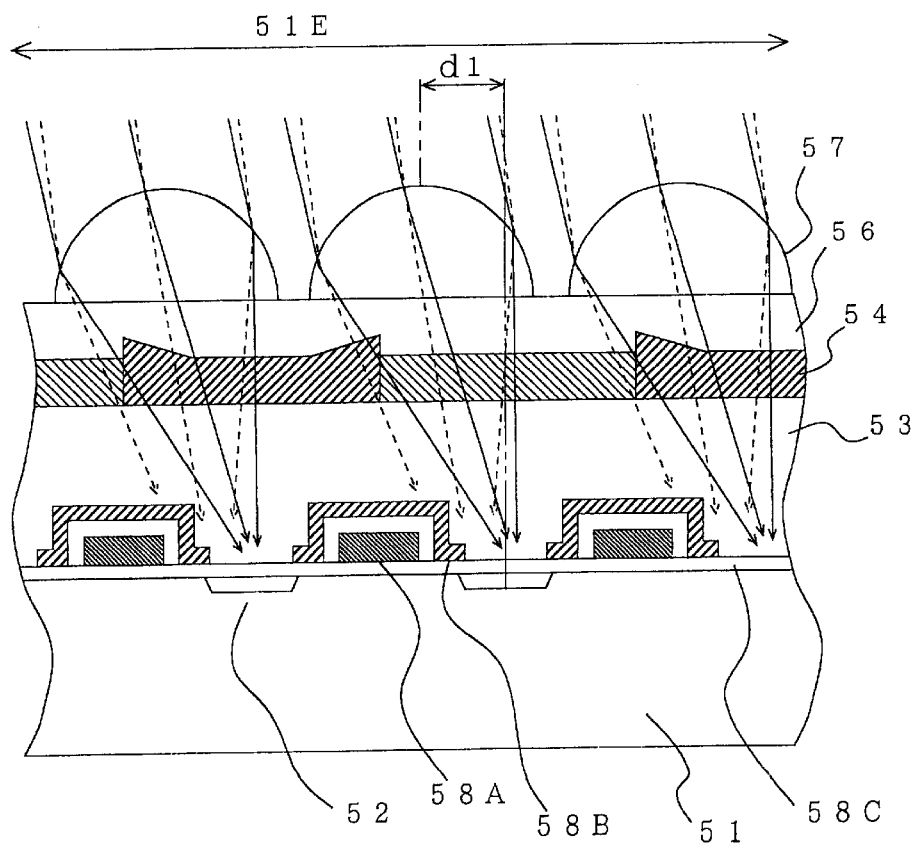
FIG. 40 is a cross-sectional view of a magnified part of a solid-state image sensor 50 wherein the "micro-lens positional offsetting" method of the previous art has been applied.

The inventors determined that, in the solid-state image sensor, even when the center of a micro-lens 57 of a peripheral part 51E of the valid cell area is placed offset only by a specified distance d1 from the center of a light-receiving part 52 by applying the "micro-lens positional offsetting", a portion of the incident lights converged onto the light-receiving part 52 by a micro-lens 57 of the peripheral part 51E, can not become incident to the light-receiving part 52, depending on their incidence angle, as shown in FIG. 40. This is because in the solid-state image sensor, the specified distance d1, which is the "offset amount" for the micro-lens 57, is determined by taking a predetermined incidence angle (a value defined by the F number) as the reference.

Therefore, even in the case where the same camera lens is used, if the F number is changed by changing the aperture, a portion of the incident lights do not become incident to the light-receiving part 52 in the peripheral part 51E, and the amount of converging light is decreased when compared to the central part of the valid cell area, leading to shading occurring, as shown by the broken lines in FIG. 40. In addition, in the drawing, numeral 53 is an inter-level isolation layer, numeral 54 is a color filter and numeral 56 is a flattening layer.

The solid-state image sensor 200 of the fifth embodiment decreases the shading independently from the effective F number of the camera lens.

A concrete explanation is given below.

A solid-state image sensor 200 of the fifth embodiment is a charge-coupled device-type (CCD-type) image sensor. In a valid cell area 210, wherein valid cells are arranged to form a matrix, a light-receiving part 202 formed at the top of a semiconductor substrate 201, a flattening layer 203, a color filter layer 204, a micro-lens stabilization layer 206, a micro-lens 207 are formed as shown in FIG. 12. In this case, the light-receiving part 202 and the micro-lens 207 are installed on each photodetecting cell of the valid cell area 210.

In this case, the main components of the flattening layer 203 are propylene glycol monomethyl ether acetate (PGMEA) and propylene glycol monoethyl ether acetate (PGEEA).

In addition, for the color filter layer 204, pigments corresponding to each color (red, green or blue) are dispersed in propylene glycol monomethyl ether acetate (PGMEA) and propylene glycol monoethyl ether acetate (PGEEA).

In addition, the main components of the micro-lens stabilization layer 206 are methyl 3-metoxy propionic acid (MMP) and acrylic resin.

In addition, the main components of the micro-lens 207 are PGEEA, ethyl lactate (EL) and phenolic resin.

In addition, as will be detailed later, the micro-lens 207 is made to have different optical penetrating rates for the incident lights (optical penetrating rate) for each micro-lens in each area from a central part 210A to the peripheral part 210E of the valid cell area 210 (FIG. 14).

In this solid-state image sensor 200, a vertical transfer electrode, a horizontal transfer electrode and an amplifier for reading the signal charge are installed, in the vicinity of the light-receiving part 202 on the semiconductor substrate 201. In addition, in the peripheral part of the solid-state image sensor 200, other circuits such as correlated double sampling circuits (omitted from the Figure) are installed on top of the same semiconductor substrate 201. In addition, the planar structure of the solid-state image sensor 200 is almost identical to the solid-state image sensor 100 of the first embodiment and FIG. 12 corresponds to the section along X–X' of FIG. 1.

In addition, for each light-receiving part 202, a predetermined color is selected and stains the color filter 202 of the solid-state image sensor 200.

For example, in the case of bayer array, green (G), blue (B) and red (R) pigments are implanted following the pattern indicated in FIG. 13. In this case, the electric signal from the photodetecting cell (light-receiving part 202) in which a green (G) filter is positioned is used as the signal indicating brightness (G output voltage).

The micro-lens 207 is configured to have different optical penetrating rates between the central part (block 210A) and the peripheral part (block 210E) of the valid cell area 210. The optical penetrating rate of the blocks 210B, 210C and 210D (FIG. 14) between the two areas change in a stepwise manner. In other words, the optical penetrating rate of each photodetecting cell is adjusted in a stepwise manner according to its position inside the valid cell area 210.

By determining the optical penetrating rate for each of these blocks 210A, 210B, . . . , according to, for instance, the F number of the camera lens actually used in a digital camera (refer to FIG. 18), the shading amount can be decreased for each of the block 210A, 210B, . . . .

In addition, in FIG. 14, the number of blocks (number of divisions), being 5, is small, but if the optical penetrating rate of the incident lights is varied more finely by dividing into a larger number of groups, the difference between the output from each area is smaller, and a fine adjustment of the shading (shading correction) becomes possible, allowing for the contrast steps of the image taken with the solid-state image sensor 200 to be less visible.

In the following, a method for producing the solid-state image sensor 200 of the above configuration will be explained using FIG. 15 through FIG. 17.

Figure 15:
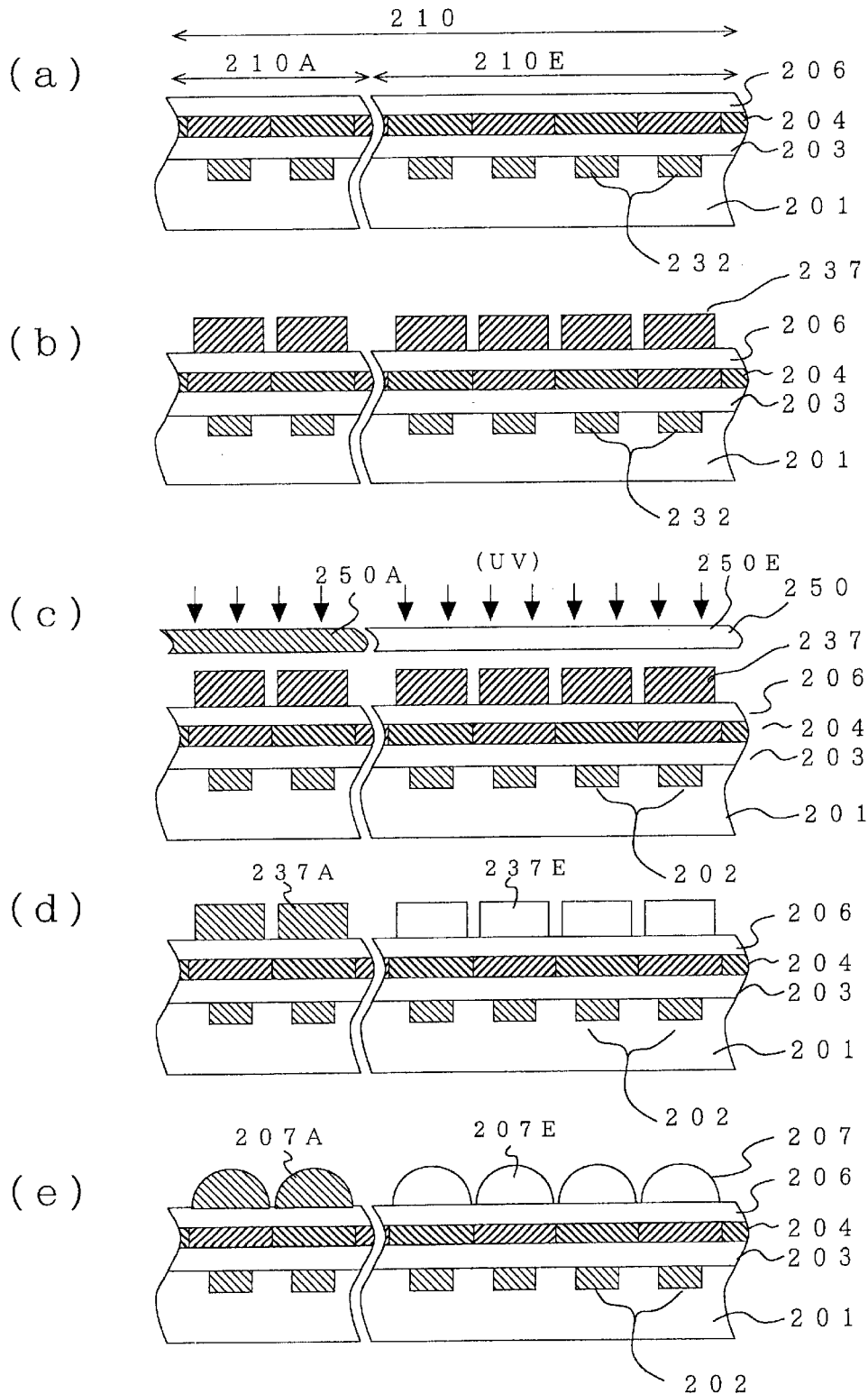
FIG. 15 is a cross-sectional view showing a production process of the solid-state image sensor 200 of a fifth embodiment.
Figure 16:
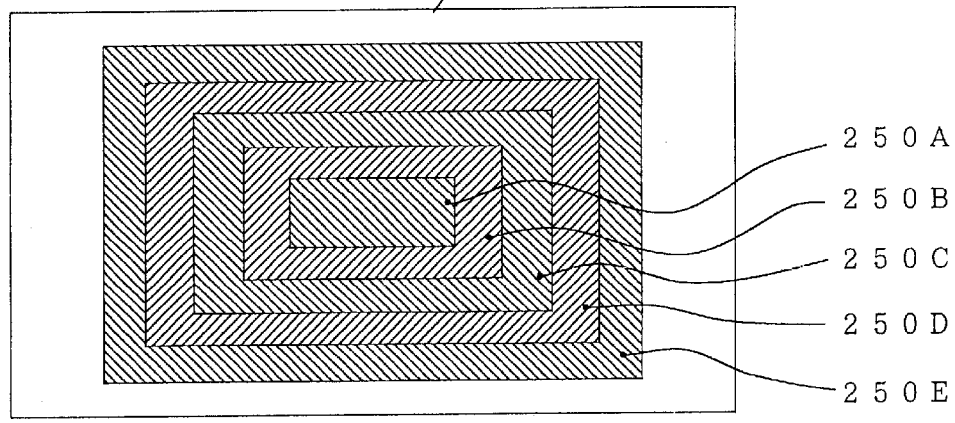
FIG. 16 is a planar view showing the layout of a mask area 250A, mask area 250B, ..., and mask area 250E, of a mask 250.

FIG. 15 is a cross-sectional view showing a production process of the solid-state image sensor 200.

To produce the solid-state image sensor 200, first, at the top of the semiconductor substrate 210, a diffusion zone 232 constituting the light-receiving part 202, or other diffusion zones constituting, for instance, transistors, and signal lines are formed. Then, on the top side of these, the flattening layer 203, a color filter layer 204, a micro-lens stabilization layer 206 are formed (FIG. 15(a)). In addition, diffusion zones and signal lines not related to the present invention are omitted from the Figure.

Then, a resin having propylene glycol monoethyl ether acetate (PGEEA), ethyl lactate (EL) and phenolic resin as the main components is used to spin-coat the top side of the semiconductor substrate 201, prior to patterning into the required shape with a publicly known lithography method, to form a rectangular micro-lens base 237 as shown in FIG. 5(b).

Then, a mask 250 is used, allowing the ultraviolet optical penetrating rate for ultraviolet lights to differ in a stepwise manner for the blocks 210A, 210B, . . . , 210E of the valid cell area 210, to expose the micro-lens base 237 with ultraviolet light. This exposure to ultraviolet light is performed to render the micro-lens base 237 forming the micro-lens 207 transparent (back exposure), and the optical penetrating rate of the micro-lens base 237 is decreased by decreasing the ultraviolet exposure dose (hereafter, simply called "back exposure dose").

In addition, the optimum value for the back exposure dose depends on conditions (for instance the output of the light source) on the side of the actual exposing apparatus used (omitted from the drawing). However, it is considered to be about 3 times the exposure dose used to expose the resist used for the patterning of the micro-lens base 237 (for instance, when using NSR150G4D (trademark) made by Nikon, it is about 5 seconds).

Up to this stage of the process, in the central part 210A of the valid cell area 210, a rectangular micro-lens base 237A having a low optical penetrating rate is formed, in the peripheral part 210E, a rectangular micro-lens base 237AE having a high optical penetrating rate (more transparent) is formed, as shown in FIG. 15.

After the micro-lens bases 237A, . . . , 237E having different optical penetrating rates between the central part 210A and the peripheral part 210E have been formed, a heat treatment is performed (140° C. to 220° C.) on the semiconductor substrate 201, using a hot plate. With this heat treatment, the micro-lens bases 237A, . . . , 237E are re-flow soldered to become hemispheric.

As a result, in the solid-state image sensor 200, a micro-lens 207A having a low optical penetrating rate is formed in the central part 210A, and a micro-lens 207E having a high optical penetrating rate is formed in the peripheral part 210E.

Here, the mask 250 used when exposing the micro-lens base 237 to ultraviolet light will be explained.

As mentioned above, the optical penetrating rate of the micro-lens 207 of the valid cell area 210 is defined according to the blocks 210A, 210B, . . . (FIG. 14). Therefore, the mask 250 is also divided into a plurality of mask areas (5 in this case) 250A, 250B, . . . , 250E having different ultraviolet optical penetrating rates according to these blocks 210A, 210B, . . . as shown in FIG. 16.

Figure 17:
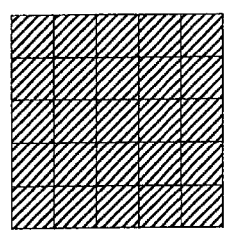
FIG. 17 is a planar view showing the patterns of microdomains in the mask, for differentiating the optical penetrating rate for ultra violet rays of the mask area 250A, the mask area 250B, ..., and the mask area 250E.
Figure 17:
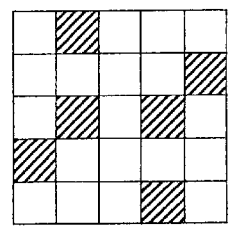
Figure 17:
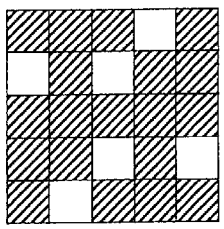
Figure 17:
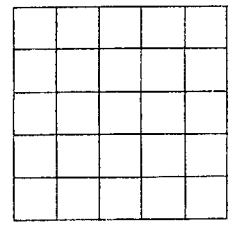
Figure 17:
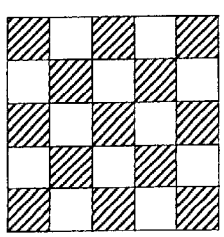

In each mask area 250A, 250B, . . . , 250E, the ultraviolet optical penetrating rate is adjusted by microscopic areas (a) through (e), where two types of microscopic squares are arranged to form a mosaic, one type of microscopic square transmitting the ultraviolet light (white cutout in the drawing) and one type of microscopic square not transmitting the ultraviolet light (hatched part), shown in FIG. 17. This microscopic area (10 μm×10 μm size photodetecting cell) is divided into microscopic squares of 5×5.

In other words, the microscopic area (a) is formed in the above-mentioned mask area 250A, the microscopic area (b) is formed in the above-mentioned mask area 250B, the microscopic area (c) is formed in the above-mentioned mask area 250C, the microscopic area (d) is formed in the above-mentioned mask area 250D, and the microscopic area (e) is formed in the above-mentioned mask area 250E.

In this case, the ultraviolet optical penetrating rate is 0% in the mask area 250A, the ultraviolet optical penetrating rate is 24% in the mask area 250B, the ultraviolet optical penetrating rate is 52% in the mask area 250C, the ultraviolet optical penetrating rate is 76% in the mask area 250D, and the ultraviolet optical penetrating rate is 100% in the mask area 250E.

In addition, the larger the number of divisions into microscopic areas as shown in FIGS. 17(a) to (e), the smaller the irregularities due to back exposure using the mask 250, and therefore, the more preferable.

In addition, to adjust the ultraviolet optical penetrating rate in each mask area 250A, 250B, . . . , 250E, it is possible to have different area ratio between the two types of microscopic square.

In addition, it is acceptable to adjust the optical penetrating rate in each mask area 250A, 250B, . . . , 250E by pasting metal films having different transparencies for each of the mask area 250A, 250B, . . . , 250E.

In the following, a single-lens reflex digital camera 300 loaded with the solid-state image sensor 200 of the embodiment will be explained.

Figure 18:
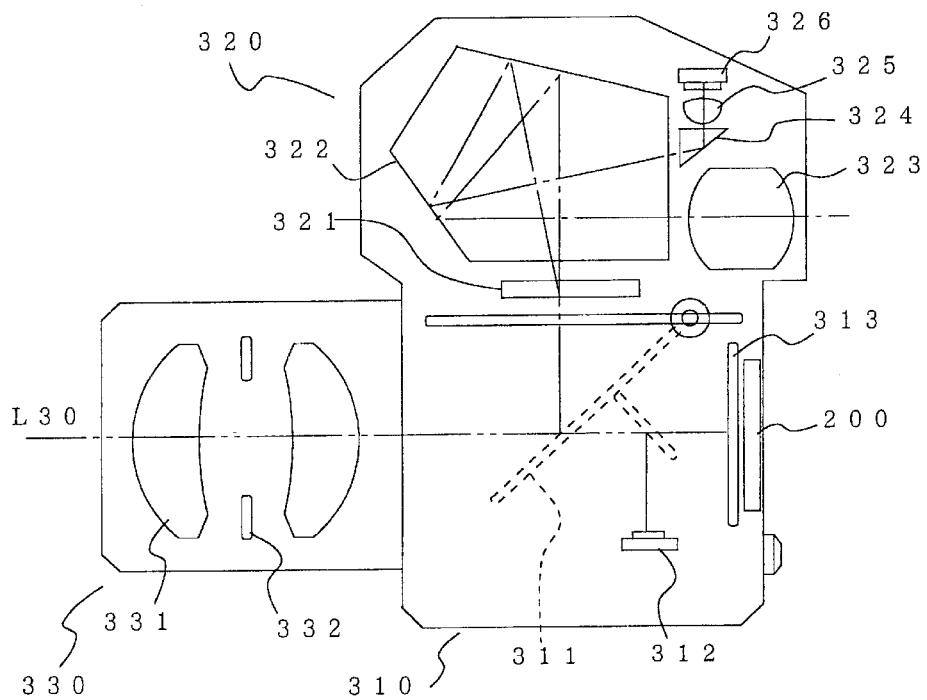
FIG. 18 is a view showing the overall structure of a digital single-lens reflex camera 300 loaded with the solid-state image sensor 200.

As shown in FIG. 18, the single-lens reflex digital camera 300 consists of a camera body 310, a viewfinder 320 and an exchangeable lens 330.

In this case, a photographic lens 331 and an iris 332 are built into the exchangeable lens 330 which is flexibly fastened to the camera body 310.

In addition, a quick-turn mirror 311, a focus detector 312 and a shutter 313 are installed in the camera body 310. In addition, the solid-state image sensor 200 is placed behind the shutter 313.

In addition, a finder mat 321, a pendaprism 322, an eye-piece 323, a prism 324, an imaging lens 325 and a white balance sensor 326 are installed in the viewfinder 320.

In a single-lens reflex digital camera 300 configured as mentioned above, the light L30 from the subject is incident to the camera body 310, through the exchangeable lens 330.

In this case, before release, the quick-turn mirror 311 is in the position shown by the broken lines in the drawing, and therefore, a portion of the light L30 from the subject reflected by the quick-turn mirror 311 is directed into the viewfinder 320 and is imaged onto the finder mat 321. A portion of the subject image taken at this point is directed via the pendaprism 322 to the eye-piece 323, another portion becomes incident to the white balance sensor 326 via the prism 324 and the imaging lens 325. The white balance sensor 326 detects the color temperature of the subject image. In addition, at this point, a portion of the light L30 from the subject is reflected by the auxiliary mirror 311A affixed to the quick-turn mirror 311 and imaged onto the focus detector 312.

After release, the quick-turn mirror 311 rotates clockwise in the drawing (shown by solid lines in the Figure), and the light L30 from the subject becomes incident to the shutter 313.

Therefore, when taking a picture, first, after the convergence of the focal point has been detected by the focus detector 312, the shutter 313 opens. With the opening movement of the shutter 313, the light L30 from the subject becomes incident to the solid-state image sensor 200 and is imaged onto its light-receiving side.

Figure 37:
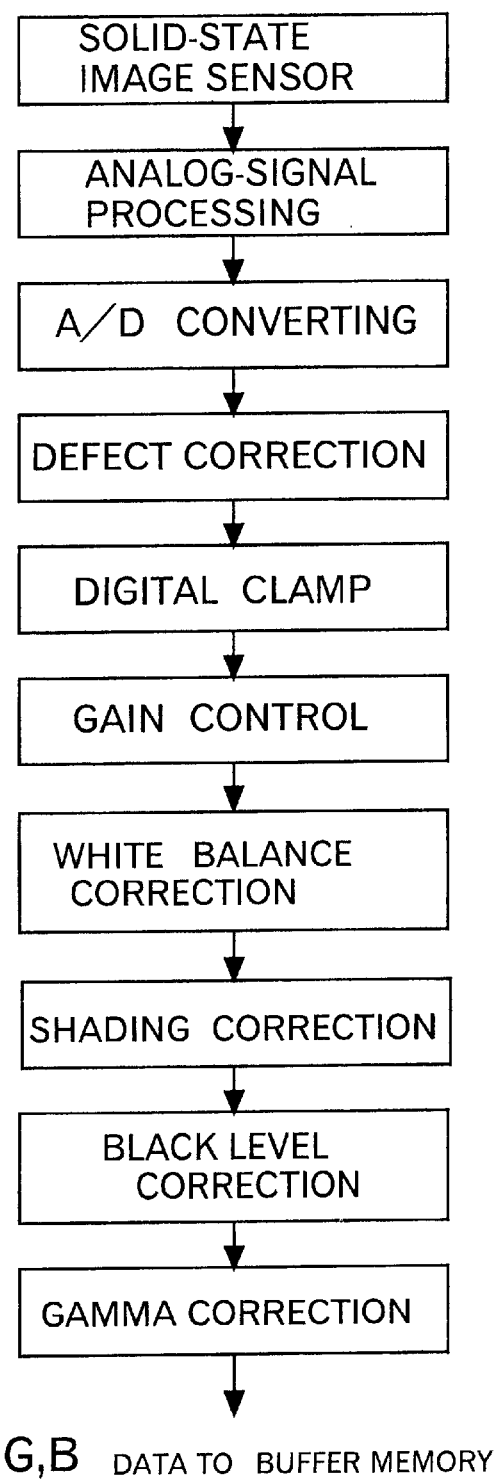
FIG. 37 is a correction flow chart showing the image processing performed on the digital camera side.

The solid-state image sensor 200 which received the light L30 from the subject, generates the electric signal corresponding to the light L30 from the subject, and at the same time performs various image signal processing on the electric signal (see FIG. 37), such as a white-balance correction based on signals from the white balance sensor 326, and outputs the processed image signals (RGB data) to the buffer memory (omitted from the figure).

In the above image signal processing, the shading correction is performed according to actual shading amounts. Therefore, in the digital camera loaded with the solid-state image sensor 200 of the invention, the influence of the shading is already removed from the signal charge outputted from the solid-state image sensor 200, and it is possible to omit the shading correction step in the image signal processing.

In addition, if enough shading correction could not be performed in the solid-state image sensor 200 due to, for instance, a variation in the F number, it is possible to execute a shading correction at the image signal processing stage. In this case, the difference or the color difference being small, the system load due to shading correction is small.

In the following, the results of measurements to assess how much the shading amount can be decreased by adjusting the optical penetrating rate of the micro-lens 207 will be described in detailed.

In this case, using a mask having the minimum ultraviolet optical penetrating rate (0%) and a mask having the maximum ultraviolet optical penetrating rate (100%), a back exposure of micro-lens was performed for each (0% back exposure and 100% back exposure) and the extent of the change for the optical penetrating rate of the micro-lens was measured. In addition, because it is not possible to directly measure the optical penetrating rate of a single micro-lens, the "G output voltage (equivalent to sensitivity etc . . . ,)" obtained for each case have been compared.

To prevent any influence due to other factors from appearing in the results of both measurements, the single-lens reflex digital camera loaded with a solid-state image sensor with 0% back exposure and the single-lens reflex digital camera loaded with a solid-state image sensor with 100% back exposure were placed against each other and positioned to align the central axis of each camera lens, a picture was taken under the same predetermined condition, and the "G output voltage" of the event was measured. The camera lens used was a NIKKOR 50 mm F1.4S (trade mark), and the subject was a uniformly bright picture without any pattern.

Figure 19:
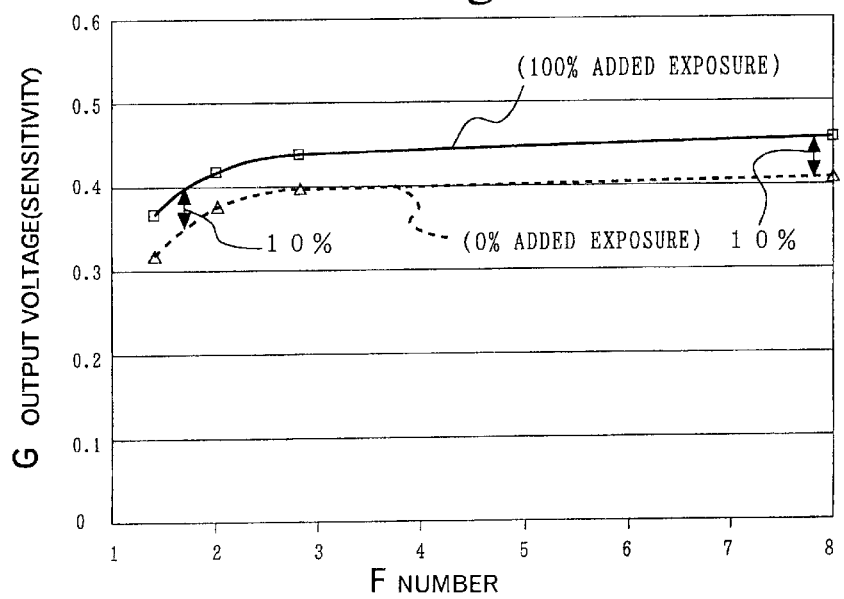
FIG. 19 is a graph showing the difference between the G output voltage when the optical penetrating rate for ultraviolet rays is 0% and the G output voltage when the optical penetrating rate for ultra-violet rays is 100%, as a function of the F number.

The "G output voltage" obtained in the above-mentioned condition is shown in FIG. 19.

In the drawing, the broken line is the "G output voltage" of the solid-state image sensor with 0% back exposure and the solid line is the "G output voltage" of the solid-state image sensor with 100% back exposure.

As is clear from the drawing, there is a difference of about 10% between the "G output voltage". In addition, it can be established that the F number dependency of the difference in the "G output voltage" is extremely low.

By adjusting the ultraviolet optical penetrating rate of the mask 250 between 0% and 100% as described above, the "G output voltage" of the solid-state image sensor can be varied by about 10%.

Therefore, when producing one solid-state image sensor 200, to perform the back exposure on the micro-lens 207, by using a mask 250 in which the ultraviolet optical penetrating rate differs in each of the mask areas 250A, 250B, . . . , 250E, the optical penetrating rate of the blocks 210A, 210B, . . . , of the solid-state image sensor 200 can be converted into "G output voltage" and freely adjusted within a range of about 10%.

Figure 20:
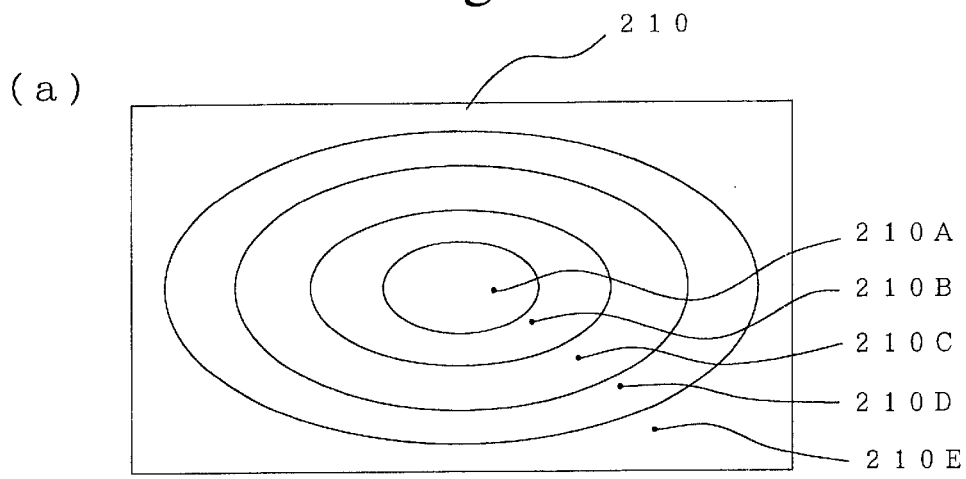
FIG. 20 is a planar view showing another layout of the block 210A, the block 210B, ... of the solid-state image sensor 200.
Figure 21:
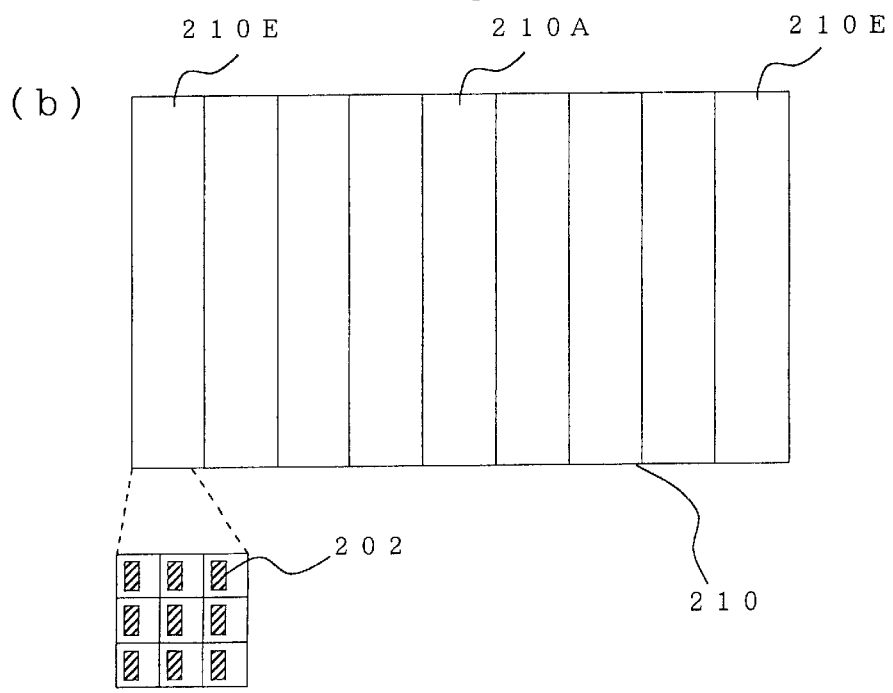
FIG. 21 is a planar view showing yet another layout of the block 210A, the block 210B, ... of the solid-state image sensor 200.

In addition, the division of the valid cell area 210 into blocks 210A, 210B, 210C, . . . is not limited to the pattern shown in FIG. 14, and, depending on the characteristics of the camera, or the user's idea, for example, as shown in FIG. 20, blocks 210A, 210B, 210C . . . can be formed by concentric circles from the center of the valid cell area 210, or as shown in FIG. 21, blocks 210A, 210B, 210C . . . can be formed as stripes in the vertical direction from the center of the valid cell area 210. In this case, the longer direction of the valid cell area 210 is divided into blocks 210A, 210B . . . since the converging characteristics in the direction of the short axis (left-right direction of the FIG. 21) of the light-receiving part (photoelectric converter) 202 of each photodetecting cell decreases when approaching the peripheral part (left and right edges, in the drawing) of the valid cell area 210 and leading to a prominent shading, and by simply assigning block 210A, block 210B, block 210C . . . as shown in FIG. 21, a sufficient shading correction effect can be obtained.

In addition, without dividing the valid cell area 210 into blocks 210A, block 210B, block 210C, . . . , an equivalent effect can be obtained by gradually changing the optical penetrating rate, for one photodetecting cell (one light-receiving part 202) at a time, or for a plurality of photodetecting cells at a time.

In fact, in the embodiment, for each mask area 250A, 250B, . . . Of the mask 250, the ultraviolet optical penetrating rate is advantageously set to 0%, 24%, 52%, 76% and 100%. The "G output voltage" actually obtained in this case, when the ultraviolet optical penetrating rate of the mask 250 falls into the 100% to 52% range, showed an increase following the order 100%>76%>52%. However, when the ultraviolet optical penetrating rates were 52%, 24%, 0%, no noticeable difference could be identified. As shown previously, there is an appropriate range for the ultraviolet exposure rate of the mask 250 for displaying an effect on the "G output voltage (corresponding to the optical penetrating rate) ". Therefore, by setting the ultraviolet optical penetrating rate within the aforementioned appropriate range, a desired optical penetrating rate can be easily realized for a valid cell area at a desired position of the solid-state image sensor.

(Sixth Embodiment)

Figure 22:
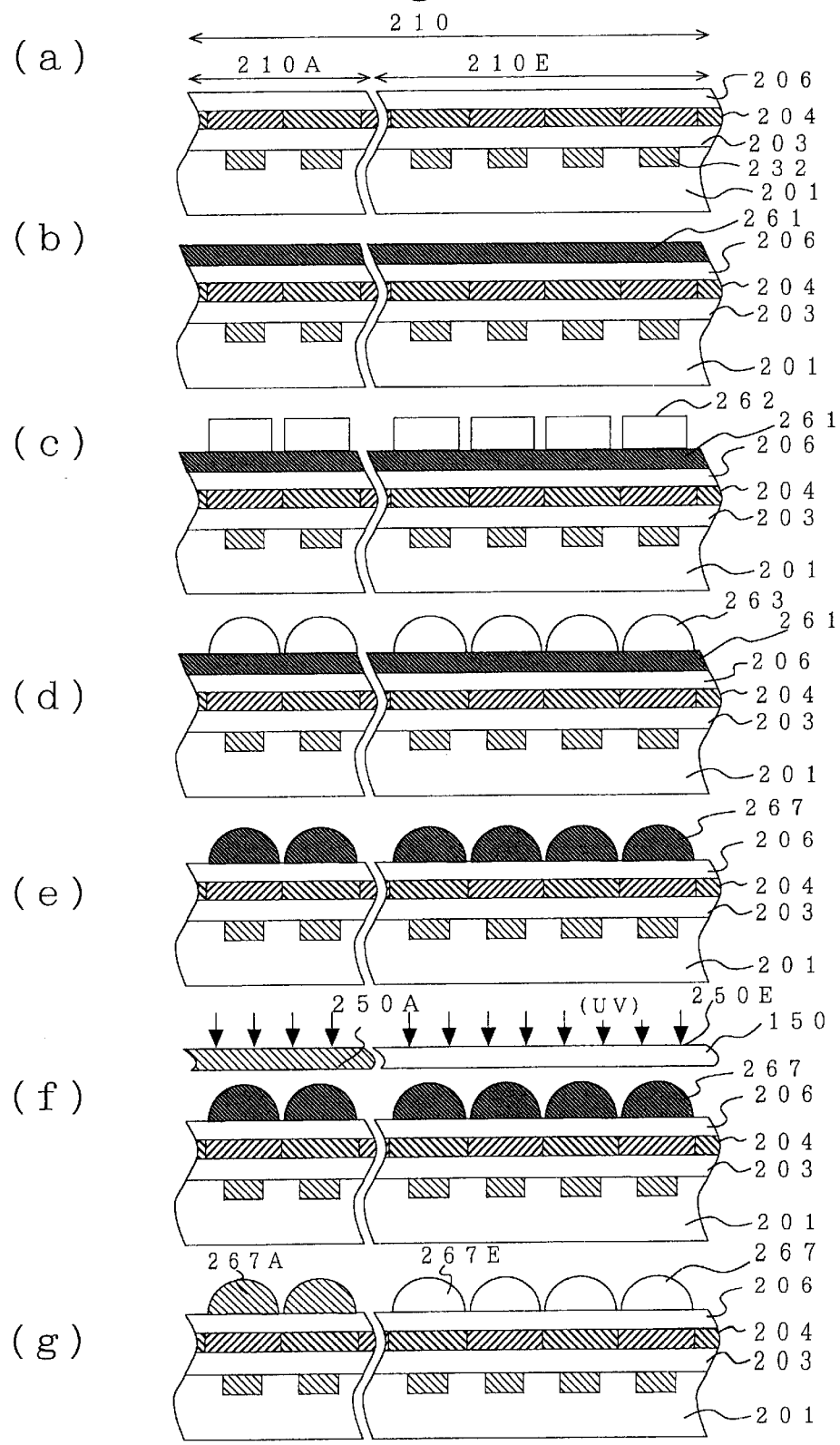
FIG. 22 is a cross-sectional view showing a production process of the solid-state image sensor 200 of a sixth embodiment.

In the following, the sixth embodiment according to the invention will be explained using FIG. 22.

The sixth embodiment is the solid-state image sensor 200 wherein the micro-lens 207 is formed by a so-called "etch back method".

Also in the sixth embodiment, first, at the top of a semiconductor substrate 201 the diffusion zone 232 constituting the light-receiving part 202 is formed, on top of these, the flattening layer 203, the color filter layer 204, the micro-lens stabilization layer 206 are formed (FIG. 22(a))

Then a uniform micro-lens layer 261 is formed by spin-coating (FIG. 22(b)).

A photoresist layer 262 then coats the top side of the micro-lens layer 261 formed, to transfer the shape of the micro-lens 207, prior to patterning the photoresist layer with the desired shape by the photolithography technique (FIG. 22(c))

A heat treatment is performed on the photoresist layer 262 patterned with the desired shape, and re-flow soldered to form a hemispheric photoresist layer 263 (FIG. 22(d)).

Next, dry etching is performed on the hemispheric resist layer 263 which is then etched back to transfer the hemispheres from the resist layer 263 onto the micro-lens layer 261. The result is the formation of a hemispheric micro-lens 267 whose transparency is not sufficient (FIG. 22(e)).

Finally, "back exposure" is performed on the hemispheric micro-lens layer 267 to render it transparent. The conditions for the "back exposure" are the same as in the fifth embodiment, and the details are omitted here (FIG. 22(f)).

By performing the above "back exposure", a micro-lens 267 (267A, 267E) is obtained, wherein the optical penetrating rate is different between the central part 210A and the peripheral part 210E (FIG. 22(g)).

In addition, in the sixth embodiment, the "back exposure" is performed onto a hemispheric micro-lens 267 formed by the etch back method. However, this does not constitute a limitation, and for instance, immediately after coating the micro-lens layer 261, "back exposure" can be performed on the micro-lens layer 261, and the optical penetrating rate (transparency) of the micro-lens 267 changed, at this stage. Then, in this case, a hemispheric micro-lens 267 is formed by the above-mentioned etchback method.

(Seventh Embodiment)

Figure 23:
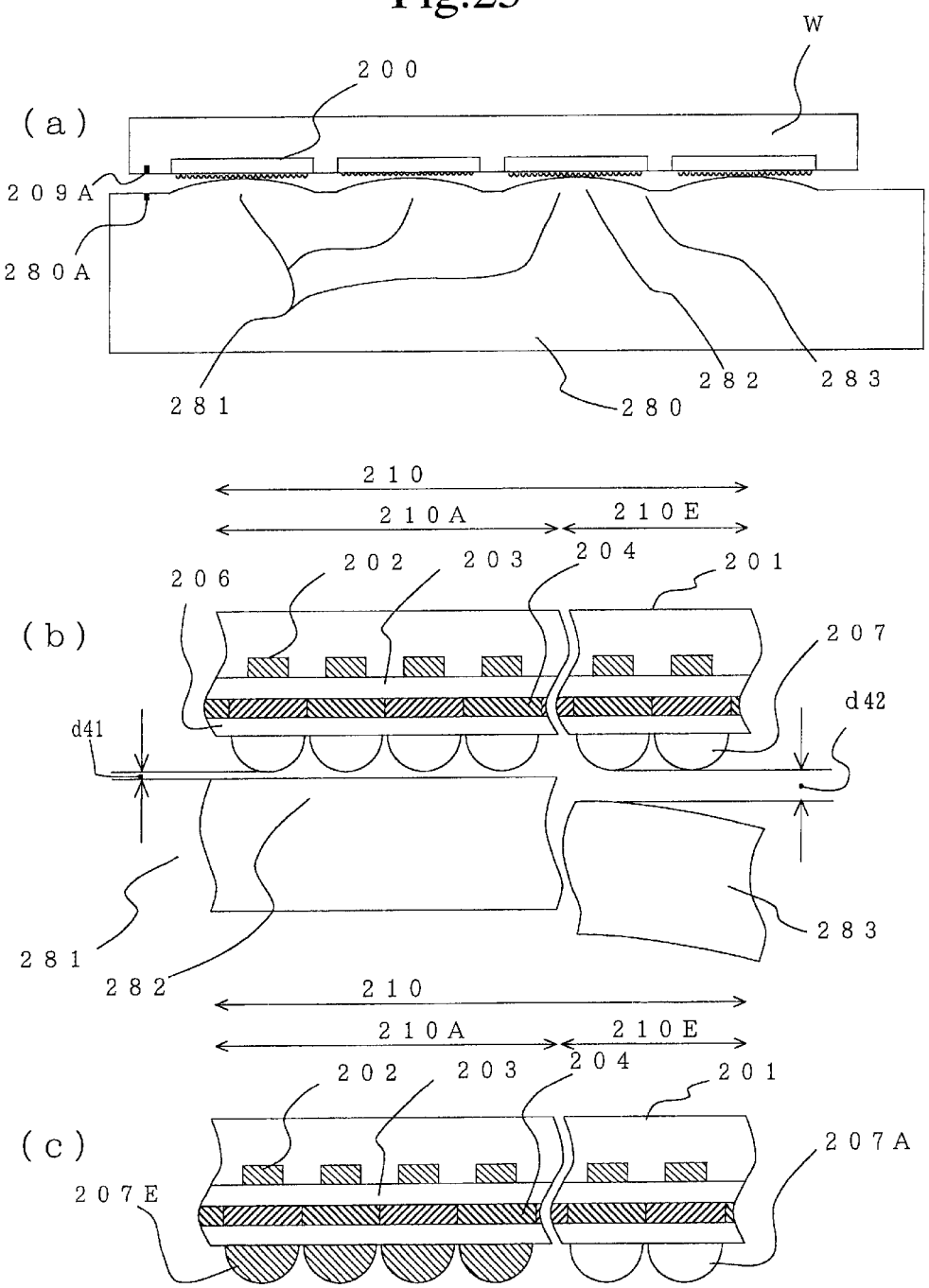
FIG. 23 is a view of the part of a production process of a seventh embodiment of the solid-state image sensor 200 showing how the optical penetrating rate is modified by heating a micro-lens 207.

In the following, the seventh embodiment in relation to the method of production of the solid-state image sensor 200 will be explained using FIG. 23.

In the above-mentioned fifth and sixth embodiments, to obtain a different optical penetrating rate for the micro-lens 207, the irradiation amount during "back exposure" of the micro-lens 207 or the micro-lens layer 261 has been differentiated, in the seventh embodiment the temperature distribution is differentiated when performing the heat treatment on the hemispheric micro-lens 207 to obtain a micro-lens 207 in which the optical penetrating rate follows the temperature distribution.

The embodiment exploits the characteristics of the micro-lens layer 261 having propylene glycol monoethyl ether acetate (PGEEA), ethyl lactate (EL) and phenolic resin as the main components, whose optical penetrating rate becomes lower when heated with high temperatures.

In the following, the heat treatment of hemispheric micro-lens 207 formed on the micro-lens stabilization layer 206 will be explained.

In addition, except for the fact that "back exposure" is not performed, the other production processes are identical to the fifth and sixth embodiments.

To heat the micro-lens 207 installed on the valid cell area 210 of the solid-state image sensor 200, with a different temperature for each of the block 210A, block 210B, etc . . . , a hot plate 280 shown in FIG. 23(a) is used.

Protruding arc-shaped parts 281, 281, . . . are formed on the surface of the hot plate 280. On the surface of the hot plate 280, a semiconductor wafer W, in which a plurality of solid-state image sensor are formed, is placed face-down.

In this case, in the central part 210A of each solid-state image sensor 200, the micro-lens 207 is separated by a slight gap d41 and faces the apex parts 282, 282, . . . of each protruding part 281, 281, . . . of the hot plate 280, (FIG. 23(b)). At this point, the central part 210A is heated approximately at the temperature set for the hot plate 280 (for example 220° C.).

On the other hand, in the peripheral part 210E of the solid-state image sensor 200, the micro-lens 207 is separated by a predetermined distance d42 (for instance 1 mm to 5 mm) and faces the bottom part 283, 283, . . . , of the hot plate 280 (FIG. 23(b)). The peripheral part 210E is heated at a temperature lower than the temperature set for the hot plate 280 (220° C.) due to the predetermined distance d42.

As described above, by setting the temperature of the hot plate 280 and the predetermined distance d42 to desired values, the optical penetrating rate of the micro-lens 207 (207A) of the central part 210A and the optical penetrating rate of the micro-lens 207 (207E) of the peripheral part 210E of the solid-state image sensor 200 can be adjusted to different values.

In this case, an alignment mark 209A as shown in FIG. 23(a) is required to superimpose the hot plate 280 and the semiconductor wafer W, and when the hot plate 280 and the semiconductor wafer W are superimposed, the difference in the alignment is at maximum 0.5 mm, and even if the superposition is offset by this maximum value, the influence on the decrease of shading amount is not important. Particularly, for a solid-state image sensor 200 having a large valid cell area 210, even if the center of the photodetecting cell in the area where the optical penetrating rate is lowered (central part 210 A) is offset from the center of the valid cell area 210 of the solid-state image sensor 200, the influence on the whole image is small.

(Eighth Embodiment)

Figure 24:
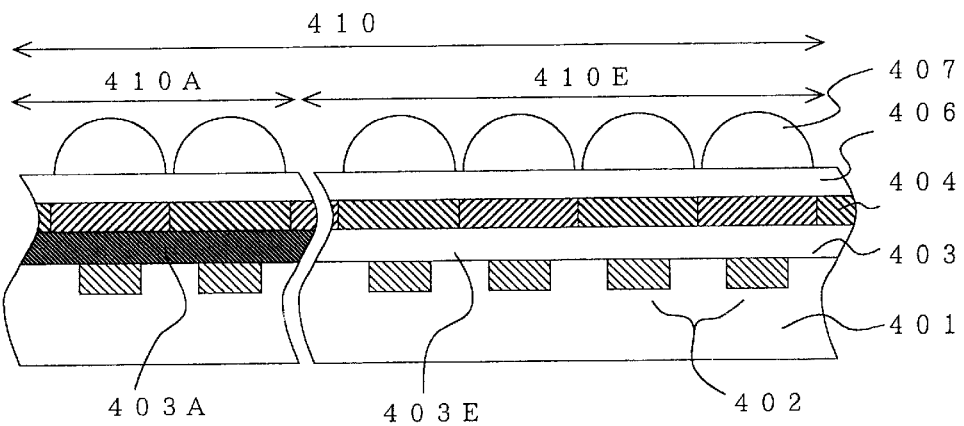
FIG. 24 is a cross sectional-view of an eighth embodiment of a solid-state image sensor 400.
Figure 25:
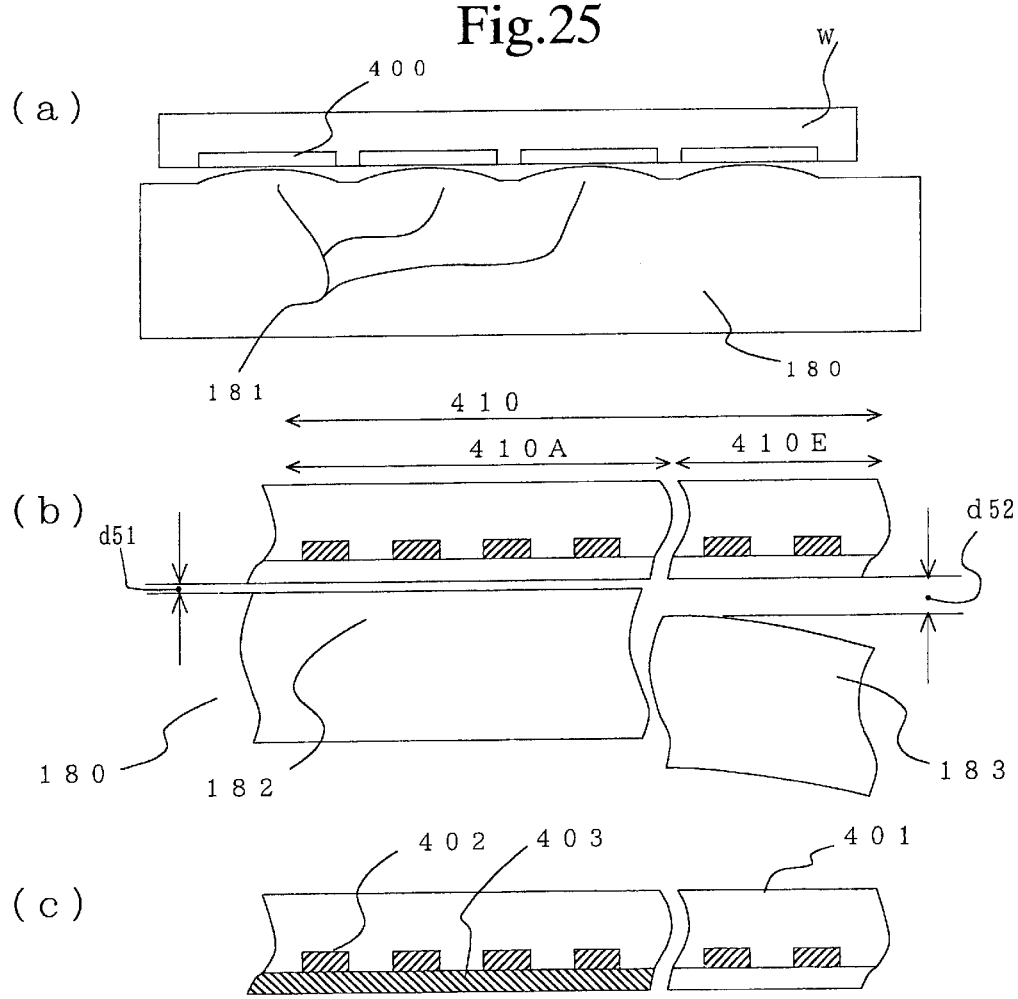
FIG. 25 is a view of the part of a production process of the eighth embodiment of the solid-state image sensor 400, showing how the optical penetrating rate is modified by heating a flattening layer 403.

In the following, the eighth embodiment according to the invention will be explained using FIG. 24 to FIG. 26.

A solid-state image sensor 400 of the eighth embodiment, has optical penetrating amounts of incident light varied in a central part 410A and a peripheral part 410E obtained by differentiating the optical penetrating rate of a flattening layer 403 underneath a micro-lens 407.

In other words, the method for producing the solid-state image sensor 400 of the eighth embodiment exploits the characteristics of the flattening layer 403 having propylene glycol monomethyl ether acetate (PGMEA) and propylene glycol monoethyl ether acetate (PGEEA) as the main components, whose optical penetrating rate becomes lower when heated with high temperatures.

The solid-state image sensor 400 of the eighth embodiment consists of a semiconductor substrate 401, a light-receiving part 402, the flattening layer 403, a color filter layer 404, a micro-lens stabilization layer 406, the micro-lens 407. In addition, all layers but the flattening layer 403 are identical to the fifth embodiment and the detailed explanation thereof will be omitted.

In this case, to vary the optical penetrating rate of the flattening layer 403, a heat treatment is performed on the flattening layer 403 to differentiate the temperature distribution, before the micro-lens 407 is formed on the surface the flattening layer 403.

To differentiate the temperature for heating the flattening layer 403, between the central part 410A and the peripheral part 410E of the solid-state image sensor 400, a hot plate 280 identical to the seventh embodiment is used (FIG. 25(a)).

When heating, as shown in FIGS. 25(a) and (b), a semiconductor wafer W, is placed face-down and in the central part 410A of each solid-state image sensor 400, the flattening layer 403 is separated by a slight gap d51 and faces the apex parts 282, 282, . . . Of each protruding part 281, 281, . . . of the hot plate 280, (FIG. 25(b)). At this point, the central part 410A is heated approximately at the temperature set for the hot plate 180 (for example 240° C.).

In the peripheral part 410E of the solid-state image sensor 400, the flattening layer 403 is separated by a predetermined distance d42 (for instance 1 mm to 5 mm) and faces the bottom part 183, 183, . . . , of the hot plate 180 (FIG. 25(b)). The peripheral part 410E is heated at a temperature lower than the temperature set for the hot plate 180 (240° C.) due to the predetermined distance d42.

Therefore, by setting the temperature of the hot plate 180 and the predetermined distance d42 to desired values, the optical penetrating rate of the flattening layer 403 of the central part 410A and the optical penetrating rate of the flattening layer 403 of the peripheral part 410E of the solid-state image sensor 400 can be adjusted to different values.

Figure 26:
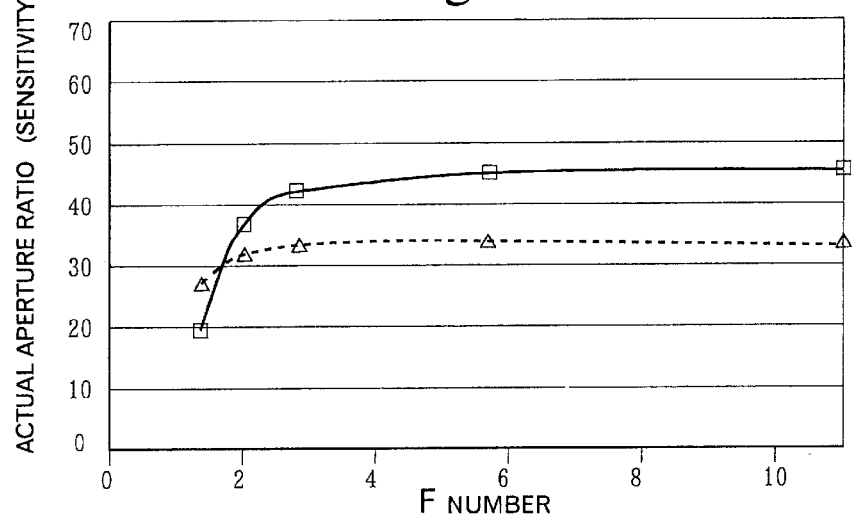
FIG. 26 is a graph showing the difference between the effective aperture ratio when the optical penetrating rate of the flattening layer 403 is 100% and the effective aperture ratio when the optical penetrating rate of the flattening layer 403 is 70%, as a function of the F number, in the solid-state image sensor 400.

The broken line in FIG. 26 show the results of measurements performed on a solid-state image sensor wherein the shading amount is decreased by changing the optical penetrating rate of the flattening layer 403 within the valid cell area 410.

The above-mentioned measurement results are calculated values of "effective aperture rates" when using a solid-state image sensor 400 wherein the valid cell area 410 was 25.1 mm in the horizontal direction and 16.9 mm in the vertical direction, and the optical penetrating rate of the peripheral part of the flattening layer 403 of the solid-state image sensor 400 was 100% and the optical penetrating rate of the central part of the flattening layer 403 of the solid-state image sensor 400 was 70%.

In this case, the "effective aperture rate" is (amount of incident light at the level of the photovoltaics)/(total amount of incident light at the level of a photodetecting cell unit). This "effective aperture rate" corresponds to the "G output voltage"

In addition, in FIG. 26, Δ is the actually measured value of effective aperture rate for the central part (correspond to the sensitivity, the G output voltage) and □ is the calculated value of the effective aperture rate for the peripheral part.

When the results of the measurements of FIG. 26 are compared to the case of a solid-state image sensor of the prior art wherein all the structures but the flattening layer are the same (for example solid-state image sensor 20 of FIG. 36), the ratio between the "effective aperture rate" of the central part 410A and the "effective aperture rate" of the peripheral part 410E is greater for lower F numbers. This indicates that the shading amount can be considerably decreased.

Figure 36:
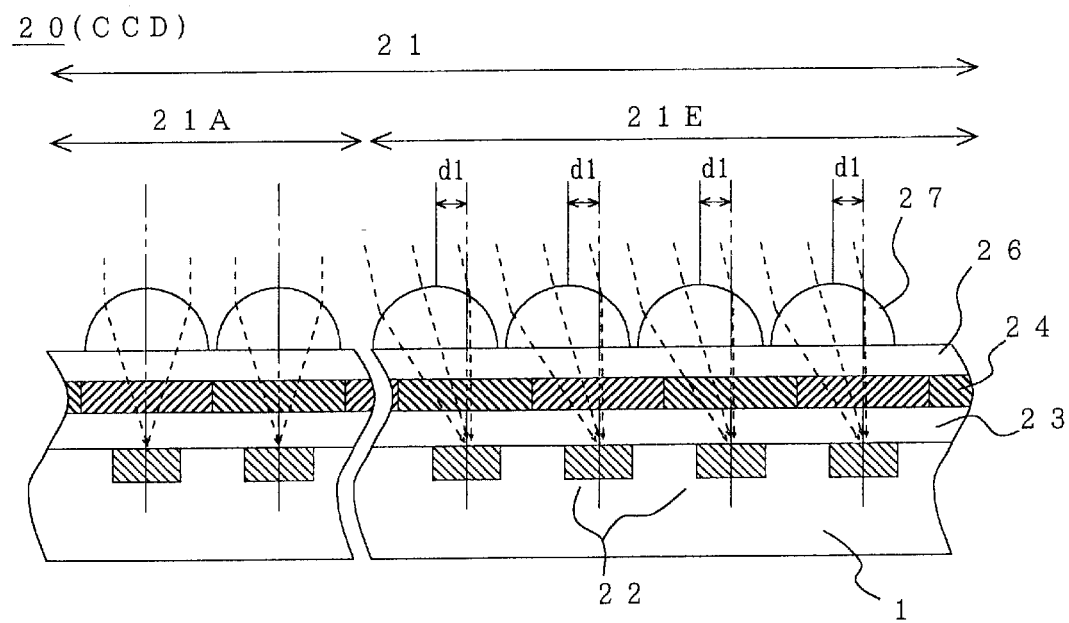
FIG. 36 is a cross-sectional view of a solid-state image sensor 20 wherein the "micro-lens positional offsetting" method of the previous art has been applied.

The above-mentioned ratio of the "effective aperture rate" could be improved to about 73%, when comparing the cases where the flattening layer 403 of the eighth embodiment is used and when it is not used (in the measurements of FIG. 36 the ratio of the "effective aperture rate" between the peripheral part and the central part is about 45% at F1.4).

(Ninth Embodiment)

In the following, the ninth embodiment according to the invention will be explained using FIG. 27 to FIG. 30.

In the solid-state image sensor 500 of the ninth embodiment, the optical penetrating rate to incident light at the level of the central part and the peripheral part, is controlled by an optical penetrating rate controlling layer 600 attached as one piece on the light-receiving side to the solid-state image sensor 500. In the embodiment, an all solid-type electro-chromic element (hereafter EC layer) is used as the optical penetrating rate controlling layer 600.

Figure 27:
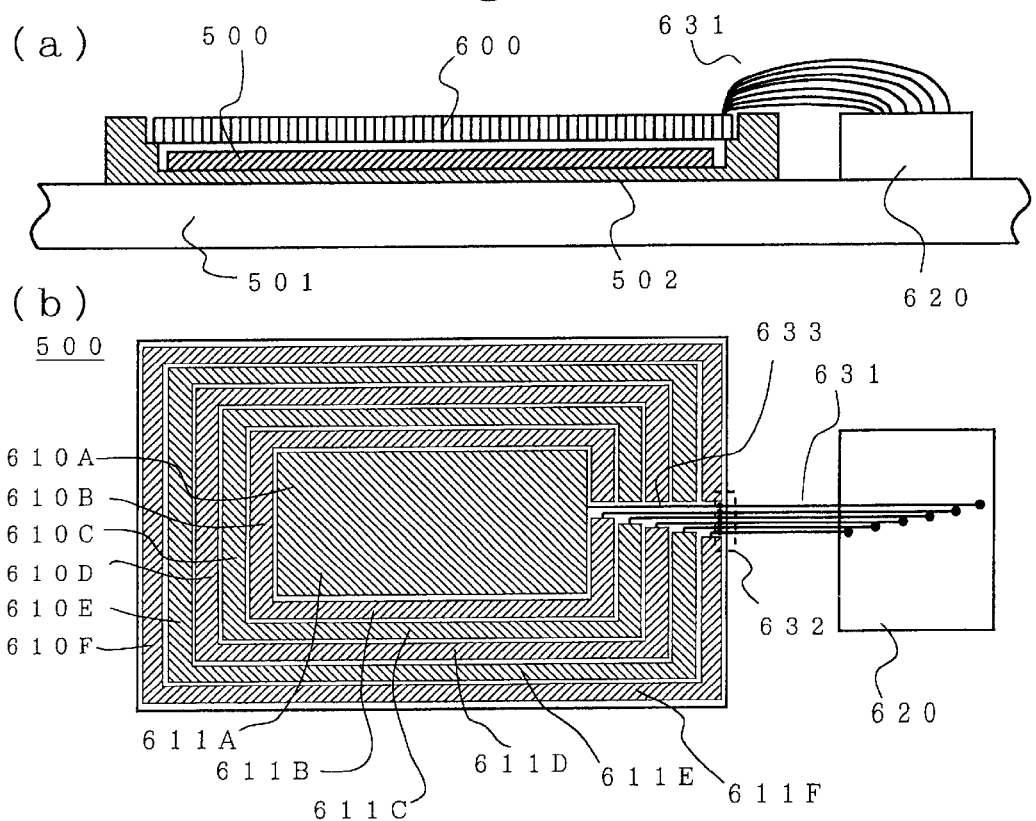
FIG. 27 is a view showing the cross-sectional form and the planar form of a ninth embodiment of a solid-state image sensor 500.
Figure 28:
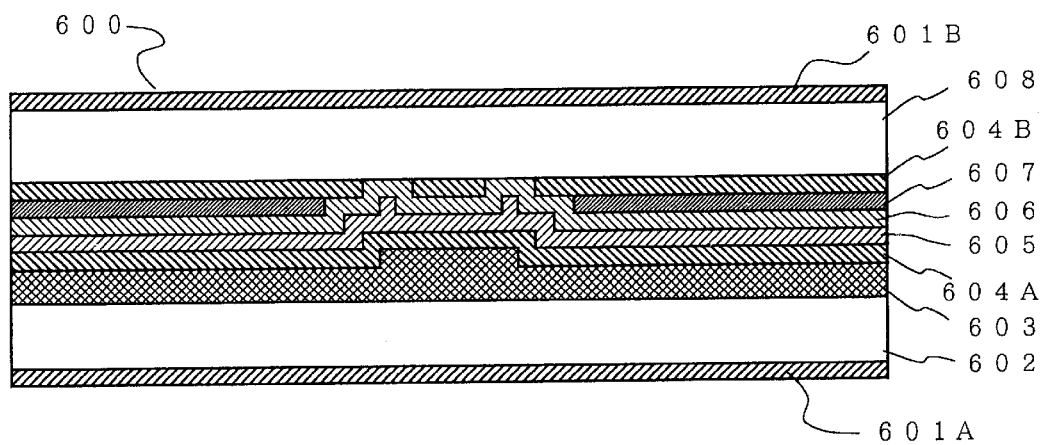
FIG. 28 is a cross-sectional view showing a magnification of a part of an optical penetrating rate controlling layer (EC layer) 600.

The solid-state image sensor 500 of the ninth embodiment, is housed in the packaging base 502 and attached on the print-base 501 of the digital camera, as shown in FIG. 27.

The optical penetrating rate controlling layer 600 attached to the upper part of the solid-state image sensor 500, is divided into a plurality of blocks 610A, 610B, . . . , and can control the optical penetrating rate for each of the blocks 610A, block 610B, . . . , as shown in FIG. 27(b).

In addition, a plurality of ITO electrodes 611 are installed on the optical penetrating rate controlling layer 600 to handle each of the block 610A, block 610B . . . . The aforementioned ITO electrodes 611A, 611B, . . . are electrically connected via the wiring part 632 to the connecting part 633 formed at one end of the optical penetrating rate controlling layer 600.

Then, a variable voltage controller 620 is electrically connected via the wires 631, 631, . . . to the connecting part 632, The desired voltage is supplied from the variable voltage controller to each ITO electrode 611A, 611B, . . . individually.

Here, the structure of the optical penetrating rate controlling layer (EC layer) 600 will be explained.

The optical penetrating rate controlling layer (EC layer) 600 consists of an anti-reflecting layer 601A, a cover glass 602, a transparent adhesive layer 603, a lower ITO layer 604A, a tungstate layer 605, a tantalate layer 606, an irradiate layer 607, a further upper ITO layer 604B, glass substrate 604B and an anti-reflecting layer 601B.

In this case, the irradiate layer 607 is sandwiched between the lower ITO layer 604A and the upper ITO layer 604B. In addition, the lower ITO layer 604A and upper ITO layer 604B form the ITO electrodes 611, 612 . . . .

In an optical penetrating rate controlling layer (EC layer) 600 having the previously-described configuration, the difference in electric potential between the ITO layer 604A and the ITO layer 604B is controlled and makes it possible to adjust the optical penetrating rate of the irradiate layer 607.

In addition, to control the optical penetrating rate of the irradiate layer using the optical penetrating rate controlling layer (EC layer) 600, it is sufficient to change the difference in electric potential between the ITO layer 604A and the ITO layer 604B within a specified range (−1.0 to 1.3V, for example). This makes it possible to control gradually and reversibly the optical penetrating rate for the incident light (wavelength 633 nm, for example) from about 70% to 17% (studies by Ishikawa et al., Nippon Shashin Gakkai Shi, Vol. 60, No 5, 1997/9, pp. 303–306).

Therefore, in the embodiment, for example, by setting the difference in electric potential of the ITO electrodes 611, 612, . . . in the block 610A, 610B, . . . to +1.3V for block 610A, to +0.8V for block 610B, to +0.6V for block 610C, to +0.4V for block 610D, to 0V for block 610E and to −1.0V for block 610F, optical penetrating rate can be set to about 17%, 28%, 40%, 50%, 65% and 70%, from the central part to the peripheral part of the solid-state image sensor 500. In this case, a correction of 4.1 times is possible for the optical penetrating amount between the central part and the peripheral part of the solid-state image sensor 500.

Therefore, even for a solid-state image sensor having an extremely large valid cell area (for instance, with 35 mm in the horizontal direction and 24 mm in the vertical direction), the shading amount can be decreased as an entire solid-state image sensor 500 by controlling the optical penetrating rate of the peripheral part where the decrease in brightness due to shading is significant, and the central part where the influence of shading is not important.

In addition, the ITO electrodes 611A, 611B, . . . are characterized by a blurred contour of the limit between an area where the electrode is on and an area where the electrode is off, therefore, in an optical penetrating rate controlling layer (EC layer) 600 using ITO electrodes 611A, 611B, . . . , the limits between each of the block 610A, 610B, . . . are not displayed in the image after shading correction.

In the following, the outline of the control of the optical penetrating rate of the optical penetrating rate controlling layer (EC layer) 600 by the variable voltage controller 620 will be explained.

Figure 29:
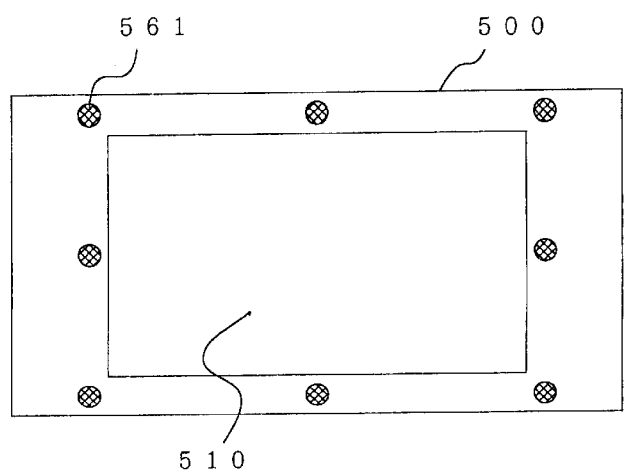
FIG. 29 is a view showing the positioning pattern of a light sensor 561 in the periphery of a valid cell area 510 of the solid-state image sensor 500.

To control the optical penetrating rate of the block 610A, 610B, . . . of the optical penetrating rate controlling layer (EC layer) 600, light sensors 561, . . . are placed in the surroundings of the solid-state image sensor 500, as shown in FIG. 29.

Then, when taking a picture with the digital camera 300 (FIG. 18) fitted with the solid-state image sensor 500, by determining the voltage provided to the ITO electrodes 611A, 611B, . . . , based on the signals of said sensors 561, the amount of shading can be decreased according to an actual environment for taking photographic pictures (without being influenced by the F number).

Figure 30:
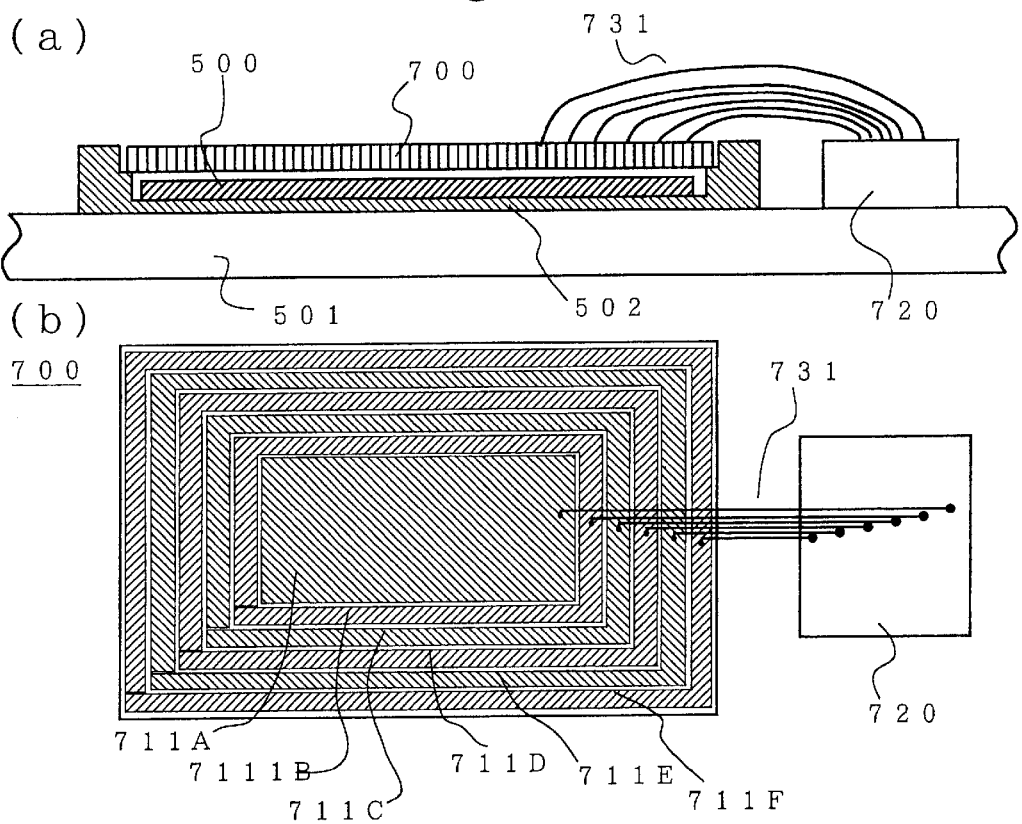
FIG. 30 is a view showing the cross-sectional form and the planar form of the solid-state image sensor 500 in relation to a variation example of the ninth embodiment.

FIG. 30 shows a variation example of the optical penetrating rate controlling layer (EC layer).

The optical penetrating rate controlling layer (EC layer) 700 in relation to the variation example differs from the optical penetrating rate controlling layer (EC layer) 600 in the layout of blocks 710A, 710B, . . . and ITO electrodes 711A, 711 B, . . . In other words, in the optical penetrating rate controlling layer (EC layer) 700, the variable voltage controller 620 and the ITO electrodes 711A, 711B, . . . are directly connected through wires. Therefore, a wiring part directing the electrodes 711A, 711B, . . . to the periphery of the optical penetrating rate controlling layer (EC layer) 700 is no longer necessary. This allows for a larger optical penetrating rate control surface to be maintained.

(Tenth Embodiment)

Figure 31:
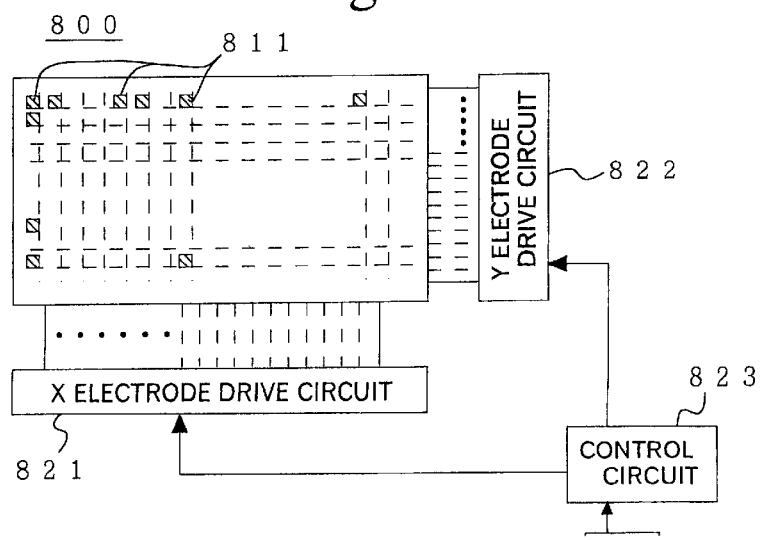
FIG. 31 is a view showing an optical penetrating rate controlling layer (EC layer) 800 for use in a CCD of a tenth embodiment
Figures 32, 33:
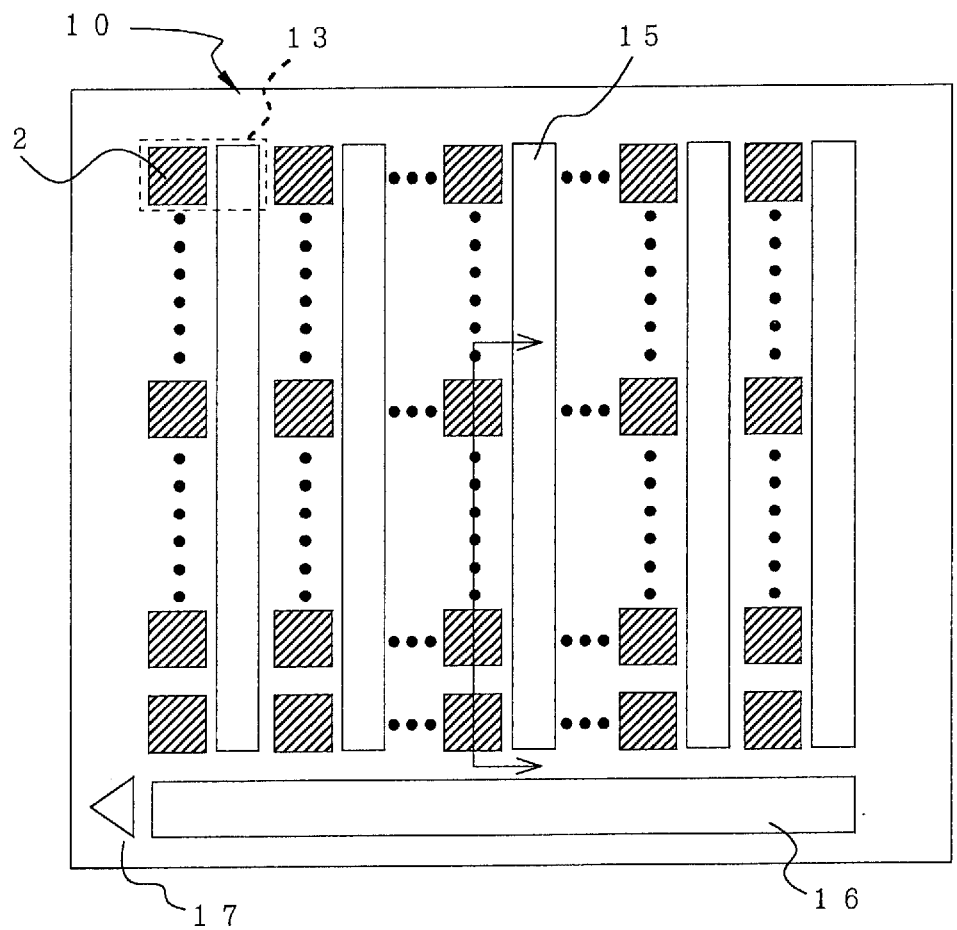
FIG. 32 is a cross-sectional view of a CCD-type solid-state image sensor 10 of the previous art.
FIG. 33 is a layout view showing an example of arrangement of the color filters of the solid-state image sensor 10 of the previous art.
Figure 34:
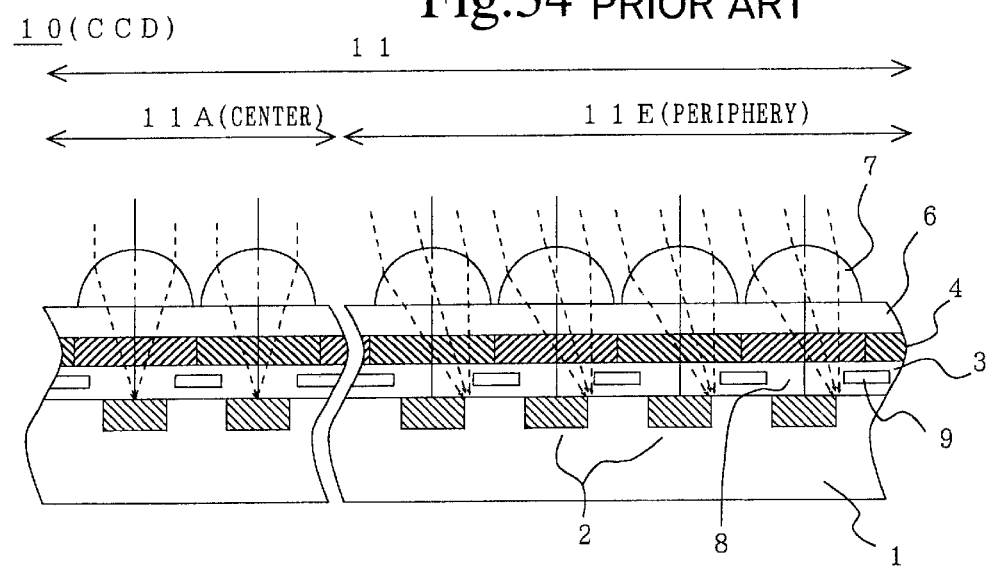
FIG. 34 is a cross-sectional view of the solid-state image sensor 10 of the previous art.
Figure 35:
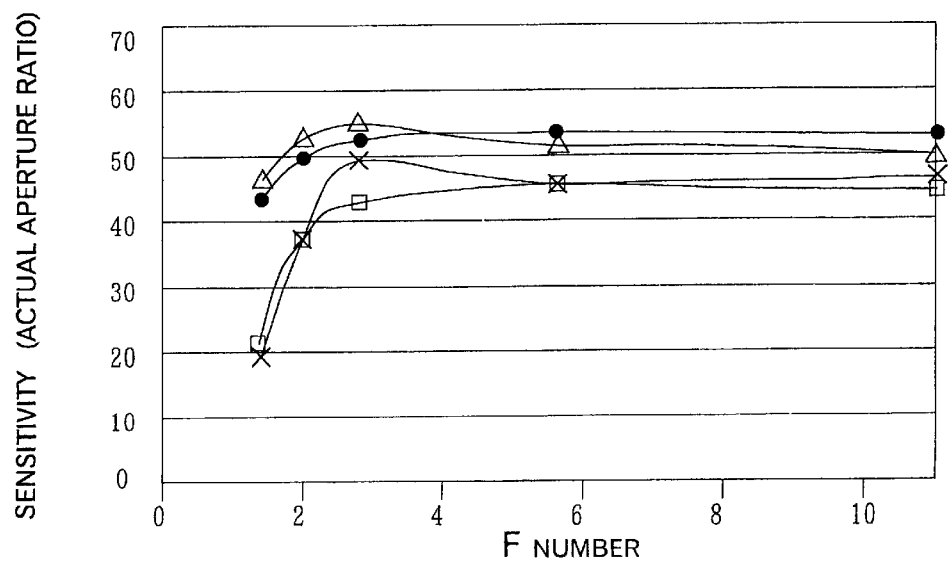
FIG. 35 is a graph showing the effects due to shading correction in the solid-state image sensor 10 of the previous art, as a function of the F number.

In the following, the tenth embodiment according to the invention will be explained using FIG. 31.

The tenth embodiment is the same as the ninth embodiment but an optical penetrating rate controlling layer (EC layer) 800 is used replacing the optical penetrating rate controlling layer (EC layer) 600 and 700 used to adjust the optical penetrating amount of solid-state image sensor 500.

The above-mentioned optical penetrating rate controlling layer (EC layer) 800 can control the optical penetrating amount of the incident lights at a central part 810A and a peripheral part 810B, at the level of each of the photodetecting cells.

In other words, ITO electrodes 811, 811 of the solid-state image sensor 500 are placed in the X direction (horizontal direction) and the Y direction (vertical direction) to form a matrix. An X electrode drive circuit 821 and a Y electrode drive circuit 822 are connected to these ITO electrodes 811, 811 . . . .

The control circuit 823 determines the voltage (difference in electric potential) that should be supplied for each of the ITO electrodes 811, 811, . . . , and supplies the desired voltage to each of the desired ITO electrode 811, 811, . . . through the X electrode drive circuit 821 and a Y electrode drive circuit 822.

As a result, in the optical penetrating rate controlling layer (EC layer) 800, the optical penetrating amount of the incident lights can be controlled for each ITO electrode 811, 811, . . . , in other words, for each photodetecting cell In addition the voltage value for each photodetecting cell (corresponding to the optical penetrating rate) can be determined based on the signal from the above-mentioned sensor 561, . . . (FIG. 26).

Using the optical penetrating rate controlling layer (EC layer) 800, the shading amount can be decreased at the level of each of the photodetecting cell of the solid-state image sensor, according to the environment of a digital camera taking a picture. Therefore, when the camera lens of the digital camera is exchanged for an exchangeable lens, or in cases where the focus is adjusted and the effective F number is changed, in each of such cases, there can be an optimal decrease of shading adapted to the conditions for taking pictures.

In addition, in the optical penetrating rate controlling layer (EC layer) of the ninth and tenth embodiment, a static voltage supply has been given as an example. However, the advantage of using the optical penetrating rate the controlling layer (EC layer) 600, 700 and 800 lies in that they allow for the electric source to vary, providing a rapid control of the optical penetrating rate to obtain a desired value. Using this function, when taking pictures with the digital camera, the brightness of the subject before the shutter motion can be read-in beforehand, and using the read-in brightness distribution, the amount of shading correction can be determined. According to the amount of shading correction thus obtained, the voltage to be supplied is determined, and the shutter is opened for the picture to be taken (in situ shading correction).

In addition, the optical penetrating rate of the optical penetrating rate controlling layer (EC layer) 600, 700 and 800 are controllable with good responses and according to the results obtained in the studies on the speed of the EC layers response, from the previously-indicated "studies by Ishikawa et al., Nippon Shashin Gakkai Shi, Vol. 60, No 5, 1997/9, pp. 303–306", it is certain that the change of optical penetrating rate will be completed in about 100–200 ms. Therefore, the optical penetrating rate controlling layer (EC layer) can be applied to the shading correction when taking pictures with an actual digital camera 300.

In addition, the above-mentioned ninth and tenth embodiments, are using the brightness information from the light sensor 561 placed in the surroundings of the valid cell area 510 of the solid-state image sensor 500 for shading correction. However, to obtain an optimal amount of shading correction, it is possible to obtain the brightness distribution in the valid cell area 510 beforehand. Among means to obtain beforehand the brightness distribution in the valid cell area 510, a possibility is to calculate the brightness information based on image data already obtained by the solid-state image sensor 500, or, based on data extracted from an image data.

In addition, in the ninth and tenth embodiments, the examples were given with the optical penetrating rate controlling layers (EC layer) 600, 700 and 800 placed on the light receiving side of the solid-state image sensor 500, however, the position for placing the optical penetrating rate controlling layer s (EC layer) 600, 700 and 800 may not necessarily be as specified. For instance, a sealing glass may be installed on the package 502 in which the solid-state image sensor is sealed, and the optical penetrating rate controlling layers may be placed above that. In addition, it is also possible to bring the solid-state image sensor 500 and the optical penetrating rate controlling layer (EC layer)600, 700, and 800, into contact, without leaving an interval in between.

In addition, the optical penetrating rate controlling layer (EC layer) 600, 700 and 800, may be placed in the space from the exchangeable lens 320 of the single-lens reflex digital camera 300 up to the solid-state image sensor 500.

In addition, in the above-mentioned ninth and tenth embodiments, explanations were given taking the example EC layers with integrated structures as the optical penetrating rate controlling layers (EC layer) 600, 700 and 800, however, other layers capable of controlling the optical penetrating rate (for example, a liquid-crystal layer) may also be used.

In addition, in the above-mentioned fifth through tenth embodiment, explanations were given with examples using a charge-coupled device-type image sensor as the solid-state image sensor, however, it is evident that the invention is applicable to other solid-state image sensors in which shading may occur (amplification image sensors, CMOS image sensors, etc . . . ).

In addition, it is evident that instead of the above-mentioned charge-coupled device-type image sensor (CCD), the invention is applicable to solid-state image sensors disclosed by the inventors in the patent No Hei. 11-87680, in other words, an amplification-type image sensor wherein implant photodiodes serving as the light-receiving part, and J-FET (junction-type FET) serving as the amplifier are placed in each photodetecting cell.

In addition, in each embodiment from the first through the fourth, it is evident that a configuration in which the aperture surface of the light blocking layer of the photodetecting cell in the peripheral part of the valid cell area is increased to be larger than the aperture surface of the light blocking layer of the photodetecting cell in the central part of the valid cell area to further limit the shading amount, is possible and is included in the scope of the invention.

The invention is not limited to the above embodiments and various modifications may be made without departing from the spirit and scope of the invention. Any improvement may be made in part or all of the components.

What is claimed is:

1. A solid-state image sensor comprising:
    a plurality of photovoltaics arrayed on the main side of a semiconductor substrate, to form a valid cell area made of a plurality of valid cells; and
    penetration adjusting means, for adjusting the optical penetrating amount of said incident lights according to the position of said photovoltaics in said valid cell area, placed on the incident side of the photovoltaics.

2. The solid-state image sensor according to claim 1, wherein said penetration adjusting means is a layer made of organic materials formed in the top part of the photovoltaics, and formed so that the optical penetrating rate is different according to the position in the valid cell area.

3. The solid-state image sensor according to claim 2, further comprising micro-lenses formed on the incident side of said photovoltaics, configured to have different optical penetrating rates which change from the peripheral part to the central part of said valid cell, due to said layer made of organic material.

4. The solid-state image sensor according to claim 2, further comprising micro-lenses placed above said photovoltaics, and wherein
    said layer made of organic materials is a flattening layer between said photovoltaics and said micro-lenses.

5. The solid-state image sensor according to claim 1, wherein:
    said valid cell area is divided into a plurality of blocks such as concentric rectangles, concentric circles or strips; and
    said penetration adjusting means adjusting the optical penetrating amount of light reaching the same block to be uniform, and to have a grater optical penetrating amount, the closer to the outermost part of said valid cell area the block is.

6. The solid-state image sensor according to claim 1, wherein:
    said penetrating adjusting means is positioned on the incident side of said valid cell area, and is optical penetrating rate controlling means capable of controlling the optical penetrating rate.

7. The solid-state image sensor according to claim 6, wherein
    said optical penetrating rate controlling means controls the optical penetrating rate based on a signal from a brightness sensor mounted around said valid cell area.

8. The solid-state image sensor according to claim 6, wherein
    said optical penetrating rate controlling means is a layer using electro-chromic elements.

9. The solid-state image sensor according to claim 1, wherein
    said penetration adjusting means respectively adjusts the optical penetrating amount for each photodetecting cell.

10. A digital camera comprising a solid-state image sensor, having:
    a plurality of photovoltaics arrayed on the main side of a semiconductor substrate, to form a valid cell area made of a plurality of valid cells; and
    penetration adjusting means, for adjusting the optical penetrating amount of the said incident light according to the position of said photovoltaics in said valid cell area, placed on the incident side of said photovoltaics.

11. A digital camera comprising:
    a camera lens; and
    a solid-state image sensor, having:
        a plurality of photovoltaics arrayed on the main side of a semiconductor substrate, to form a valid cell area made of a plurality of valid cells; and
        penetration adjusting means, for adjusting the optical penetrating amount of the said incident light according to the position of said photovoltaics in said valid cell area, placed on the incident side of said photovoltaics, and placed between said solid-state image sensor and said camera lens.

* * * * *

UNITED STATES PATENT AND TRADEMARK OFFICE
CERTIFICATE OF CORRECTION

PATENT NO.    : 6,690,049 B2
DATED         : February 10, 2004
INVENTOR(S)   : Satoshi Suzuki It is certified that error appears in the above-identified patent and that said Letters Patent is hereby corrected as shown below:

<u>Column 31,</u>
Lines 10-17, Claim 1, should read as follows:
    1. A solid-state image sensor comprising:
      a plurality of photovoltaics arrayed on the main side of a semiconductor substrate, to form a valid cell area made of a plurality of valid cells; and
      penetration adjusting means, for decreasing a shading amount, which is variation in sensitivity in said valid cell area, by making optical penetrating rate greater in said valid cell area nearer to the periphery and further from the center, the penetration adjusting means being placed on the incident side of the photovoltaics.

<u>Column 31, lines 45-49 to Column 32, line 1-5,</u>
Claim 5, should read as follows:
    5. A solid-state image sensor comprising:
      a plurality of photovoltaics arrayed on the main side of a semiconductor substrate, to form a valid cell area made of a plurality of valid cells; and
      penetration adjusting means, for adjusting the optical penetrating amount of said incident lights according to the position of said photovoltaics in said valid cell area, placed on the incident side of the photovoltaics, wherein
      said valid cell area is divided into a plurality of blocks such as concentric rectangles, concentric circles of strips, and
      said penetration adjusting means adjusts the optical penetrating amount of light reaching the same block to be uniform, and to have a greater optical penetrating amount, the closer to the outermost part of said valid cell area the block is.

<u>Column 32,</u>
Lines 6-9, Claim 6, should read as follows:
    6. The solid-state image sensor according to claim 1, wherein:
      said penetration adjusting means is positioned on the incident side of said valid cell area, and controlled by a signal supplied to the penetration adjusting means.

Lines 12-16, Claim 7, should read as follows:
    7. The solid-state image sensor according to claim 6, wherein
      said penetration adjusting means controls a rate that the optical penetrating rate increases from the center to the periphery, based on a signal from a brightness sensor mounted around said valid cell area.

UNITED STATES PATENT AND TRADEMARK OFFICE
CERTIFICATE OF CORRECTION

PATENT NO. : 6,690,049 B2
DATED : February 10, 2004
INVENTOR(S) : Satoshi Suzuki It is certified that error appears in the above-identified patent and that said Letters Patent is hereby corrected as shown below:

<u>Column 32, cont'd.,</u>
Lines 17-20, Claim 8, should read as follows:
    8. The solid-state image sensor according to claim 6, wherein said penetration adjusting means is a layer using electro-chromic elements.

Lines 26-34, Claim 10, should read as follows:
    10. A digital camera comprising a solid-state image sensor, having:
        a plurality of photovoltaics arrayed on the main side of a semiconductor substrate, to form a valid cell area made of a plurality of valid cells; and
        penetration adjusting means, for decreasing a shading amount, which is variation in sensitiviy in said valid cell area, by making optical penetrating rate greater in said valid cell area nearer to the periphery and further from the center, the penetration adjusting means being placed on the incident side of the photovoltaics.

Lines 36-47, Claim 11, should read as follows:
    11. A digital camera comprising:
        a camera lens; and
        a solid-state image sensor, having:
        a plurality of photovoltaics arrayed on the main side of a semiconductor substrate, to form a valid cell area made of a plurality of valid cells; and
        penetration adjusting means, for decreasing a shading amount, which is variation in sensitivity in said valid cell area, by making optical penetrating rate greater in said valid cell area, by making optical penetrating rate greater in said valid cell area nearer to the periphery and further from the center, the penetration adjusting means being placed on the incident side of the photovoltaics, and placed between said solid-state image sensor and said camera lens.

Signed and Sealed this

Sixth Day of July, 2004

JON W. DUDAS
*Acting Director of the United States Patent and Trademark Office*